US008236681B2

(12) United States Patent
Nagano

(10) Patent No.: US 8,236,681 B2
(45) Date of Patent: Aug. 7, 2012

(54) MANUFACTURING METHOD OF SEMICONDUCTOR INTEGRATED CIRCUIT DEVICE

(75) Inventor: Makoto Nagano, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 343 days.

(21) Appl. No.: 12/716,928

(22) Filed: Mar. 3, 2010

(65) Prior Publication Data
US 2010/0227470 A1 Sep. 9, 2010

(30) Foreign Application Priority Data

Mar. 5, 2009 (JP) ................................. 2009-051668

(51) Int. Cl.
*H01L 21/4763* (2006.01)
(52) U.S. Cl. ........ 438/622; 438/627; 438/629; 438/638; 257/E21.584; 257/E21.585
(58) Field of Classification Search ............. 438/627, 438/622, 629, 624, 637–638; 257/E21.584, 257/E21.585
See application file for complete search history.

(56) References Cited

U.S. PATENT DOCUMENTS

| 7,094,705 B2 * | 8/2006 | Lin et al. ...................... 438/710 |
| 7,232,763 B2 * | 6/2007 | Omura et al. ................. 438/700 |
| 2008/0124919 A1 * | 5/2008 | Huang et al. .................. 438/643 |
| 2009/0045704 A1 * | 2/2009 | Barber et al. ................. 310/364 |

FOREIGN PATENT DOCUMENTS

| JP | 2004-014868 | 1/2004 |
| JP | 2007-258636 | 10/2007 |

* cited by examiner

*Primary Examiner* — Michael Trinh
(74) *Attorney, Agent, or Firm* — Womble Carlyle

(57) ABSTRACT

In a formation process of a semi-global interconnect in a Cu damascene multilayer wiring structure, it is the common practice, upon formation of the damascene wiring structure, to remove an etch stop insulating film from a via bottom by dry etching and then carry out nitrogen plasma treatment to reduce carbon deposits on the surface of the via bottom. Study by the present inventors has revealed that when a sequence of successive discharging for the removal of electrostatic charge by using nitrogen plasma and transportation of the wafer is performed, a Cu hollow is generated on the via bottom at the end of the via chain coupled to a pad lead interconnect having a length not less than a threshold value. According to the invention, in a via hole formation step in a damascene semi-global interconnect or the like, dry etching treatment of a via-bottom etch stop film is performed and then, after nitrogen plasma treatment in the same treatment chamber, electrostatic charge removal treatment by using argon plasma is performed.

26 Claims, 20 Drawing Sheets

US 8,236,681 B2

MANUFACTURING METHOD OF SEMICONDUCTOR INTEGRATED CIRCUIT DEVICE

CROSS-REFERENCE TO RELATED APPLICATIONS

The disclosure of Japanese Patent Application No. 2009-51668 filed on Mar. 5, 2009 including the specification, drawings and abstract is incorporated herein by reference in its entirety.

BACKGROUND OF THE INVENTION

The present invention relates to a technology effective when applied to a damascene wiring technology in a manufacturing method of a semiconductor integrated circuit device (or a semiconductor device).

Japanese Unexamined Patent Publication No. 2004-14868 discloses a technology of, in removal of electrostatic charge (static elimination) from a wafer after plasma etching treatment performed in the same chamber of a plasma treatment apparatus, carrying out the removal by using argon plasma thorough a circumferential edge of a wafer stage configuring an electrostatic chuck while using the wafer stage as a high-resistance conductor.

Japanese Unexamined Patent Publication No. 2007-258636 discloses a technology of, in removal of electrostatic charge from a wafer after plasma etching treatment performed in the same chamber of a plasma treatment apparatus, carrying out the removal by using argon plasma while floating one end of the wafer on a wafer stage configuring an electrostatic chuck.

SUMMARY OF THE INVENTION

When, in the formation process of the uppermost-level semi-global interconnect and the like in a Cu damascene multilevel wiring structure, the damascene wiring structure is formed using a via first process, it is the common practice to carry out nitrogen plasma treatment in order to prevent formation of horizontal-direction voids along a via bottom and reduce carbon deposits on the via-bottom surface after removal of an etch stop insulating film (SiCN) from the via bottom by dry etching. The study by the present inventors has revealed that when a sequence of successive discharging for the removal of electrostatic charge (static elimination) by using nitrogen plasma and transportation of the wafer is performed, wet treatment subsequent thereto inevitably forms a Cu hollow on the via bottom at the end of the via chain coupled to a pad lead interconnect having a length not less than a threshold value, resulting in occurrence of a problem of an increase in defective ratio due to conduction failures (which will be called "via bottom conduction failures").

The present invention has been made with a view to overcoming the above-described problem.

An object of the invention is to provide a manufacturing process of a semiconductor integrated circuit device having high reliability.

The foregoing and other objects and novel features of the invention will become apparent by the description herein and accompanying drawings.

Typical inventions, of those disclosed herein, will next be described briefly.

Described specifically, one of the inventions is to carry out, in a step of forming a via hole mainly for a damascene semi-global interconnect or the like, then dry etching of a via-bottom etch stop film, carry out nitrogen plasma treatment in the same treatment chamber, and thereafter remove electrostatic charge by using argon plasma.

An advantage available by the typical inventions, of those disclosed herein, will next be described briefly.

Described specifically, in a step of forming a via hole for a damascene semi-global interconnect or the like, by successively carrying out dry etching of a via-bottom etch stop film, nitrogen plasma treatment in the same treatment chamber, and removal of electrostatic charge by using argon plasma, a charge distribution in a buried interconnect system can be leveled so that the damage of interconnects which will otherwise occur due to an electrolysis reaction in the subsequent wet treatment can be prevented.

DETAILED DESCRIPTION OF THE INVENTION

Outline of Embodiments

Figure 1:
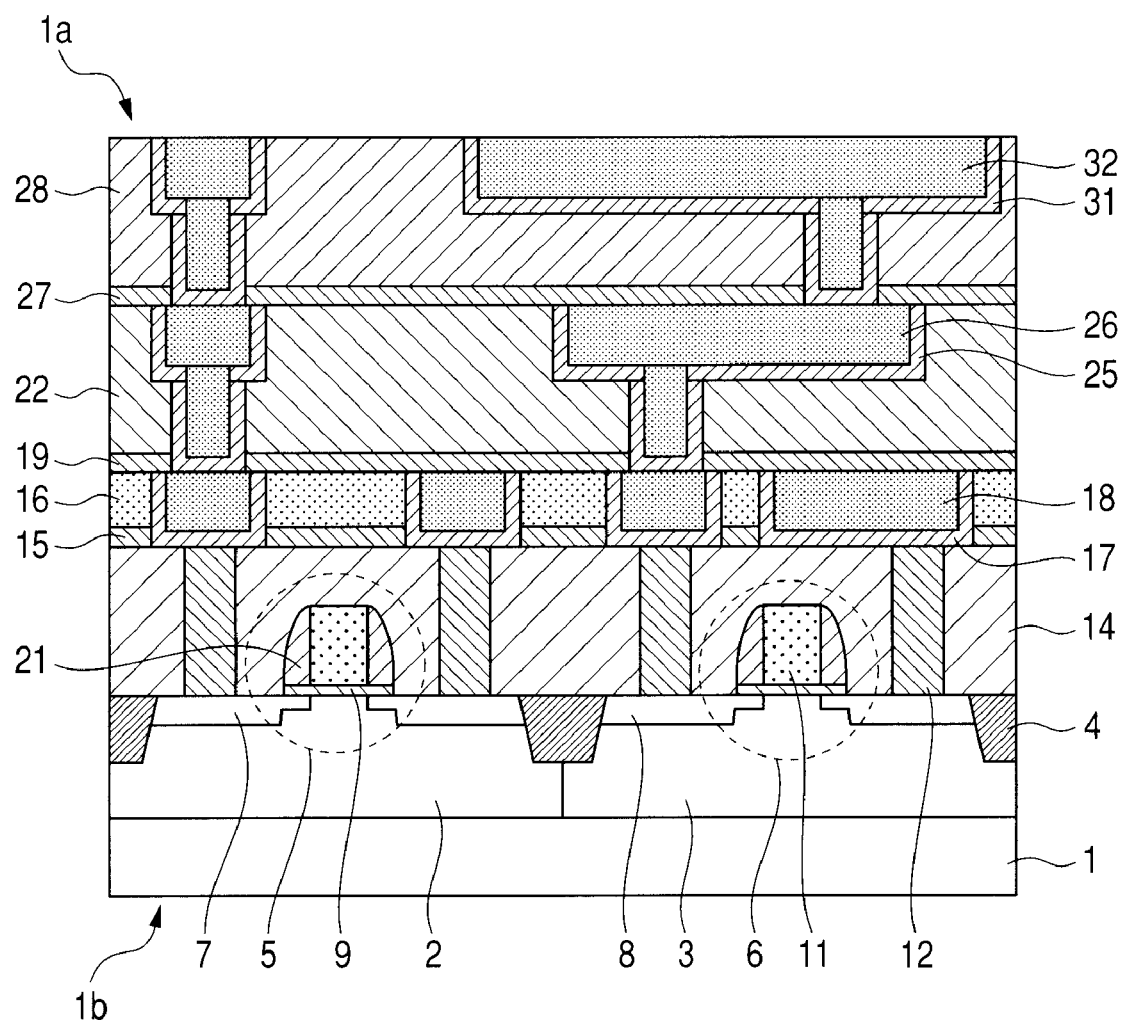
FIG. 1 is a cross-sectional view of a CMIS integrated circuit device upon formation of a third-level buried interconnect thereof, as one example of a target device of a manufacturing method of a semiconductor integrated circuit device according to one embodiment of the invention is employed.

The outline of typical embodiments of the invention disclosed herein will next be described.

1. A manufacturing method of a semiconductor integrated circuit device comprising the following steps of: (a) carrying out first dry etching to form, toward a lower-level buried interconnect disposed in an insulating film over the device surface of a wafer, a via hole that extends from the upper surface of the insulating film to the upper surface of an etch step film over the lower-level buried interconnect and is to be coupled to an upper-level buried interconnect; (b) after the step (a), carrying out, in an etching chamber, second dry etching to extend the via hole to the upper surface of the lower-level buried interconnect while causing the back surface of the wafer to adsorb onto a wafer stage with an electrostatic chuck; (c) after the step (b), subjecting, in the second etching chamber, the device surface of the wafer to gas phase plasma treatment in an atmosphere having nitrogen as a main component while placing the back surface of the wafer over the wafer stage; and (d) after the step (c), removing electrostatic charge from the wafer by using gas phase plasma in an atmosphere having argon as a main component while placing the back surface of the wafer on the wafer stage.

2. The manufacturing method of a semiconductor integrated circuit device described in 1, further comprising a step of: (e) after the step (d), subjecting at least the device surface of the wafer to wet cleaning treatment with a chemical solution outside the etching chamber.

3. The manufacturing method of a semiconductor integrated circuit device described in 1 or 2, wherein the lower-level buried interconnect is a third-level or higher level buried interconnect.

4. The manufacturing method of a semiconductor integrated circuit device described in any of 1 to 3, wherein the upper-level buried interconnect is an uppermost-level buried interconnect.

5. The manufacturing method of a semiconductor integrated circuit device described in any of 1 to 4, wherein the upper-level buried interconnect is electrically coupled to a pad electrode lying thereover.

6. The manufacturing method of a semiconductor integrated circuit device described in 5, wherein the upper-level buried interconnect is directly coupled to the pad electrode via a plug immediately therebelow.

7. The manufacturing method of a semiconductor integrated circuit device described in any of 1 to 6, wherein the upper-level buried interconnect and the lower-level buried interconnect are each a copper-based buried interconnect.

8. The manufacturing method of a semiconductor integrated circuit device described in 2, further comprising a step of: (f) after the step (d) but prior to the step (e), releasing the wafer from the wafer stage in the etching chamber.

9. The manufacturing method of a semiconductor integrated circuit device described in any of 1 to 8, wherein the etch stop film is a silicon nitride insulating film.

10. The manufacturing method of a semiconductor integrated circuit device described in any of 1 to 8, wherein the etch stop film is an SiCN film.

11. A manufacturing method of a semiconductor integrated circuit device comprising the following steps of: (a) burying a lower-level buried interconnect in the upper surface of a lower-level insulating film over the device surface of a wafer; (b) after the step (a), forming an etch stop film over the upper surface of the lower-level insulating film; (c) after the step (b), forming an upper-level insulating film over the etch stop film; (d) after the step (c), carrying out first dry etching to form a via hole that extends from the upper surface of the upper-level insulating film to the upper surface of the etch step film over the lower-level buried interconnect and is to be coupled to an upper-level buried interconnect; (e) after the step (d), carrying out second dry etching to extend the via hole to the upper surface of the lower-level buried interconnect while causing the back surface of the wafer to adsorb onto a wafer stage with an electrostatic chuck in an etching chamber; (f) after the step (e), subjecting, in the etching chamber, the device surface of the wafer to gas phase plasma treatment in an atmosphere having nitrogen as a main component while placing the back surface of the wafer on the wafer stage; and (g) after the step (f), removing electrostatic charge from the wafer by using gas phase plasma in an atmosphere having argon as a main component while placing the back surface of the wafer on the wafer stage in the etching chamber.

12. The manufacturing method of a semiconductor integrated circuit device described in 11, further comprising a step of: (e) after the step (d), subjecting at least the device surface of the wafer to wet cleaning treatment with a chemical solution outside the etching chamber.

13. The manufacturing method of a semiconductor integrated circuit device described in 11 or 12, wherein the lower-level buried interconnect is a third-level or higher level buried interconnect.

14. The manufacturing method of a semiconductor integrated circuit device described in any of 11 to 13, wherein the upper-level buried interconnect is an upper-most buried interconnect.

15. The manufacturing method of a semiconductor integrated circuit device described in any one of 11 to 14, wherein the upper-level buried interconnect is electrically coupled to a pad electrode lying thereover.

16. The manufacturing method of a semiconductor integrated circuit device described in 15, wherein the upper-level buried interconnect is directly coupled to the pad electrode via a plug immediately therebelow.

17. The manufacturing method of a semiconductor integrated circuit device described in any one of 11 to 16, wherein the upper-level buried interconnect and the lower-level buried interconnect are each a copper-based buried interconnect.

18. The manufacturing method of a semiconductor integrated circuit device described in 12, further comprising a step of: (f) after the step (d) but prior to the step (e), releasing the wafer from the wafer stage in the etching chamber.

19. The manufacturing method of a semiconductor integrated circuit device described in any one of 11 to 18, wherein the etch stop film is a silicon nitride insulating film.

20. The manufacturing method of a semiconductor integrated circuit device described in any one of 11 to 18, wherein the etch stop film is an SiCN film.

21. A manufacturing method of a semiconductor integrated circuit device comprising the following steps of: (a) burying a lower-level buried interconnect in the upper surface of a lower-level insulating film over the device surface of a wafer; (b) after the step (a), forming an etch stop film over the upper surface of the lower-level insulating film; (c) after the step (b), forming an upper-level insulating film over the etch stop film; (d) after the step (c), carrying out first dry etching to form a via hole that extends from the upper surface of the upper-level insulating film to the upper surface of the etch step film over the lower-level buried interconnect and is to be coupled to an upper-level buried interconnect; (e) after the step (d), carrying out second dry etching to extend the via hole to the upper surface of the lower-level buried interconnect while causing the back surface of the wafer to adsorb onto a wafer stage with an electrostatic chuck in an etching chamber; (f) after the step (e), subjecting the device surface of the wafer to gas phase plasma treatment in an atmosphere having nitrogen as a main component; and (g) after the step (f), removing electrostatic charge from the wafer by using gas phase plasma in an atmosphere having argon as a main component.

22. The manufacturing method of a semiconductor integrated circuit device described in 21, further comprising a step of: (e) after the step (d), subjecting the device surface of the wafer to wet cleaning treatment with a chemical solution outside the etching chamber.

23. The manufacturing method of a semiconductor integrated circuit device described in 21 or 22, wherein the lower-level buried interconnect is a third-level or higher-level buried interconnect.

24. The manufacturing method of a semiconductor integrated circuit device described in any one of 21 to 23, wherein the upper-level buried interconnect is an uppermost-level buried interconnect.

25. The manufacturing method of a semiconductor integrated circuit device described in any one of 21 to 24, wherein the upper-level buried interconnect is electrically coupled to a pad electrode lying thereover.

26. The manufacturing method of a semiconductor integrated circuit device described in 25, wherein the upper-level buried interconnect is directly coupled to the pad electrode via a plug placed immediately therebelow.

27. The manufacturing method of a semiconductor integrated circuit device described in any one of 21 to 26, wherein the upper-level buried interconnect and the lower-level buried interconnect are each a copper-based buried interconnect.

28. The manufacturing method of a semiconductor integrated circuit device described in 21 to 27, wherein the etch stop film is a silicon nitride insulating film.

29. The manufacturing method of a semiconductor integrated circuit device described in 21 to 28, wherein the etch stop film is an SiCN film.

[Explanation of Description Manner, Basic Terms, and Usage in the Present Application]

1. In the present application, a description in the embodiments may be made after divided in plural sections if necessary for convenience's sake. These plural sections are not independent of each other, but they may each be a part of a single example or one of them may be a partial detail of the other or a modification example of a part or whole of the other one unless otherwise specifically indicated. In principle, description on a portion similar to that described before is not repeated. Moreover, when a reference is made to constituent elements in the embodiments, they are not essential unless otherwise specifically indicated, limited to the number theoretically, or principally apparent from the context that it is not.

Further, the term "semiconductor integrated circuit device" as used herein means a device obtained by integrating mainly various transistors (active elements), and resistors, capacitors, and the like over a semiconductor chip or the like (for example, a single-crystal silicon substrate). Typical examples of the various transistors include MISFET (Metal Insulator Semiconductor Field Effect Transistor) typified by MOSFET (Metal Oxide Semiconductor Field Effect Transistor). Typical examples of an integrated circuit configuration include CMIS (Complementary Metal Insulator Semiconductor) type integrated circuits typified by CMOS (Complementary Metal Oxide Semiconductor) type integrated circuit having an N-channel MISFET and a P-channel MISFET in combination.

2. Similarly, with regard to any material, any composition or the like in the description of the embodiments, the term "X made of A" or the like does not exclude X having, as one of the main constituting components thereof, an element other than A unless otherwise specifically indicated or principally apparent from the context it is not. For example, the term "X made of A" means that "X has A as a main component thereof". It is needless to say that, for example, the term "silicon member" is not limited to a member made of pure silicon but also a member containing a SiGe alloy, another multi-element alloy having silicon as a main component, an additive, or the like. Similarly, the term "silicon oxide film", "silicon oxide-based insulating film", or the like is not limited to a relatively pure undoped silicon oxide (undoped silicon dioxide) but needless to say, it embraces FSG (fluorosilicate glass) film, TEOS-based silicone oxide film, SiOC (silicon oxycarbide) film, or carbon-doped silicon oxide film, a thermal oxidation film such as OSG (organosilicate glass) film, PSG (phosphorus silicate glass) film, or BPSG (borophosphosilicate glass) film, a CVD oxide film, silicon oxide films obtained by the method of application such as SOG (spin on glass) and NSC (nano-clustering silica) films, silica-based low-k insulating films (porous insulating films) obtained by introducing pores into similar members, and composite films with another silicon-based insulating film which films contain any one of the above-mentioned films as a principal constituting element.

In addition, silicon-based insulating films ordinarily used in the semiconductor field like silicon oxide insulating films are silicon nitride-based insulating films. Materials which belong thereto include SiN, SiCN, SiNH, and SiCNH. The term "silicon nitride" as used herein means both SiN and SiNH unless otherwise specifically indicated that it is not. Similarly, the term "SiCN" means both SiCN and SiCNH unless otherwise specifically indicated that it is not.

It is however to be noted that SiC and SiN have similar properties, but in many cases, SiON should be classified rather as a silicon oxide-based insulating film.

3. Preferred examples of the shape, position, attribute, and the like will be shown, however, it is needless to say that the shape, position, attribute, and the like are not strictly limited to the preferred examples unless otherwise specifically indicated or apparent from the context that it is not.

4. When a reference is made to a specific number or amount, the number or amount may be greater than or less than the specific number or amount unless otherwise specifically indicated, limited to the specific number or amount theoretically, or apparent from the context that it is not.

5. The term "wafer" usually means a single crystal silicon wafer over which a semiconductor integrated circuit device (which may be a semiconductor device or an electronic device) is to be formed. It is however needless to say that it embraces a composite wafer of a semiconductor layer and an insulating substrate such as epitaxial wafer, SOI substrate, or LCD glass substrate.

6. Names of layers forming a multilevel interconnect layer (a buried wiring structure having 4 to 12 layers is assumed herein) are classified, from lower to upper layers, into a local interconnect, semi-global interconnect, global interconnect, and the like. The definition of each of these names however differs, depending on users thereof. The uppermost-level interconnect is usually classified as a semi-global interconnect or a global interconnect. In most cases, first-level to third-level interconnect layers are classified as a local interconnect. A multi-level wiring structure having from about 4 to 10 layers sometimes has no interconnect layer classified as a global interconnect. Accordingly, the uppermost-level interconnect layer of a four-layer wiring structure which will be described later is generally classified as a semi-global interconnect.

Details of Embodiments

The embodiments will be described in more detail. In all the drawings, the same or like members will be identified by the same or like symbols or reference numerals and overlapping descriptions will be omitted in principle.

1. Description on the outline of the device structure and manufacturing process of a CMIS type integrated circuit device, which is one example of a device to which a manufacturing method of a semiconductor integrated circuit device according to one embodiment of the invention can be applied (referring to mainly from FIG. 1 to FIG. 12)

FIG. 1 illustrates one example of a typical cross-sectional structure of a device at the time of completion of the formation of a third-level buried interconnect 32 (lower-level buried interconnect or copper-based M3 damascene interconnect). Based on this example, an outline of a device structure (at the time of formation of a third-level buried interconnect) of a CMIS type integrated circuit device, which is one example of a device to which the manufacturing method of a semiconductor integrated circuit device according to the one embodiment of the invention can be applied, will be described. The description will be made with a 65 nm technology node SOC (system on chip) product as one example.

As illustrated in FIG. 1, the CMIS type integrated circuit device is usually formed on the device surface $1a$ side (a first main surface or a surface opposite to a back surface $1b$) of a single crystal P-type silicon wafer 1 (for example, 300 φ wafer, 200φ wafer, 450φ wafer, or a wafer of another size) having a relatively low impurity concentration (an N type semiconductor substrate, any of various epitaxial substrates, SOI substrate, or the like may be used). Described specifically, a P well region 2 and an N well region 3 are formed on the device surface $1a$ side of the wafer 1 and an STI insulating film 4 is placed in the surface of a silicon substrate 1 for isolating the P well region 2 from the N well region 3. An N-channel MISFET 5 is placed in the vicinity of the surface of the P well region 2, while a P channel MISFET 6 is placed in the vicinity of the surface of the N well region 3. An N type source or drain region 7 of the N channel MISFET 5 is placed in the surface of the P well region 2, while a P type source or drain region 8 of the P channel MISFET 6 is placed in the surface of the N well region 3. These N channel MISFET 5 and P channel MISFET 6 are each equipped with a gate insulating film 9, a gate electrode 11, sidewall spacer insulating film 21, and the like.

A pre-metal insulating film 14 (usually comprised of a lower-level silicon nitride film and an upper-level thick silicon oxide film, and the like) over the upper surface of a substrate portion of the wafer 1 and a tungsten plug 12 (usually comprised of a thin titanium nitride film present on the lower layer and around the plug, and a tungsten based plug itself serving as a main portion, which will hereinafter be applied equally to another tungsten plug) is buried in the pre-metal insulating film.

Over the pre-metal insulating film 14, an etch stop film 15 (for example, a silicon nitride carbide film, that is, SiCN film, but a silicon nitride-based film may be used without limitation, which will hereinafter be applied equally to another etch stop film) for a first-level buried interconnect layer and an interlayer insulating film 16 (examples include silicon oxide based films such as plasma TEOS film, but the interlayer insulating film may be any of an FSG film, an SiOC film, and a low-k silicon oxide-based insulating film; or a low-k silicon oxide based insulating film having thereover a conventional silicon oxide film stacked as a cap film is also usable, which will be applied equally to another interlayer insulating film) of the first-level buried interconnect are formed. In these films, a first-level buried interconnect 18 (copper based M1 damascene interconnect) is buried (copper is usually buried by copper electroplating or the like after formation of a seed copper layer, which will hereinafter be applied equally to another burying of copper) via a barrier metal film 17 (a film stack of tantalum nitride and tantalum is usually used, but the barrier metal film may be a film composed singly of a high-melting point metal such as ruthenium or a film stack of it with nitride thereof, which will hereinafter be applied equally to another barrier metal film) of the first-level buried interconnect layer. The first-level buried interconnect layer has a so-called single damascene structure.

Further, over the interlayer insulating film 16 of the first-level buried interconnect layer, an etch stop film 19 for the second-level buried interconnect layer and an interlayer insulating film 22 for the second-level buried interconnect layer are formed and, in these films, a second-level buried interconnect 26 (copper-based M2 damascene interconnect) is buried via a barrier metal film 25 of the second-level buried interconnect layer. The second-level buried interconnect layer (also a third-level buried interconnect layer and a fourth-level buried interconnect layer) has a so-called dual damascene structure.

Similarly, over the interlayer insulating film 22 of the second-level buried interconnect layer, an etch stop film 27 for the third-level buried interconnect layer and an interlayer insulating film 28 of the third-level buried interconnect layer are formed and in these films, a third-level buried interconnect 32 (copper-based M3 damascene interconnect) is buried via a barrier metal film 31 of the third-level buried interconnect layer.

The thickness of each of the interlayer insulating films of the first-level to the third-level buried interconnect layers is, for example, from about 100 to 200 nm. On the other hand, the interconnect pitch of each of the first-level to the third-level buried interconnects is, for example, from about 300 nm.

A manufacturing process following that of FIG. 1 will next be described. The following interconnect formation process can be applied to the uppermost-level (fourth-level) buried interconnect layer, but it can also be applied almost similarly to the second-level buried interconnect layer and the third-level buried interconnect layer. Only the formation process of the uppermost-level buried interconnect layer will hereinafter be described in detail to avoid repetition of the description.

Figure 2:
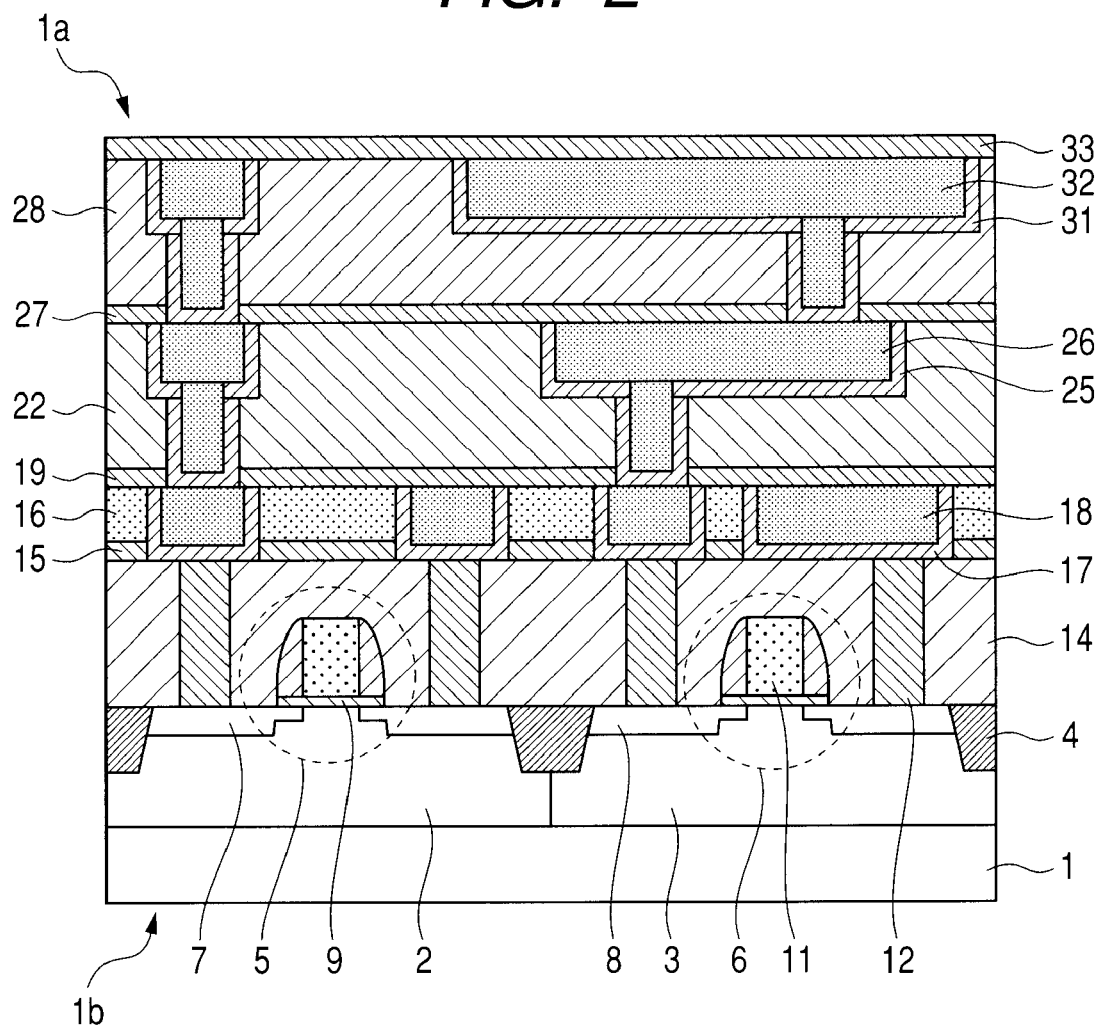
FIG. 2 is a cross-sectional view of the device in a wiring process in the a manufacturing method of a semiconductor integrated circuit device according to the one embodiment of the invention (step of forming an etch stop film of the uppermost-level buried interconnect layer)

As illustrated in FIG. 2, an etch stop film 33 of the uppermost-level (fourth-level) buried interconnect layer is formed over the interlayer insulating film 28 of the third-level buried interconnect layer by using, for example, plasma CVD.

Figure 3:
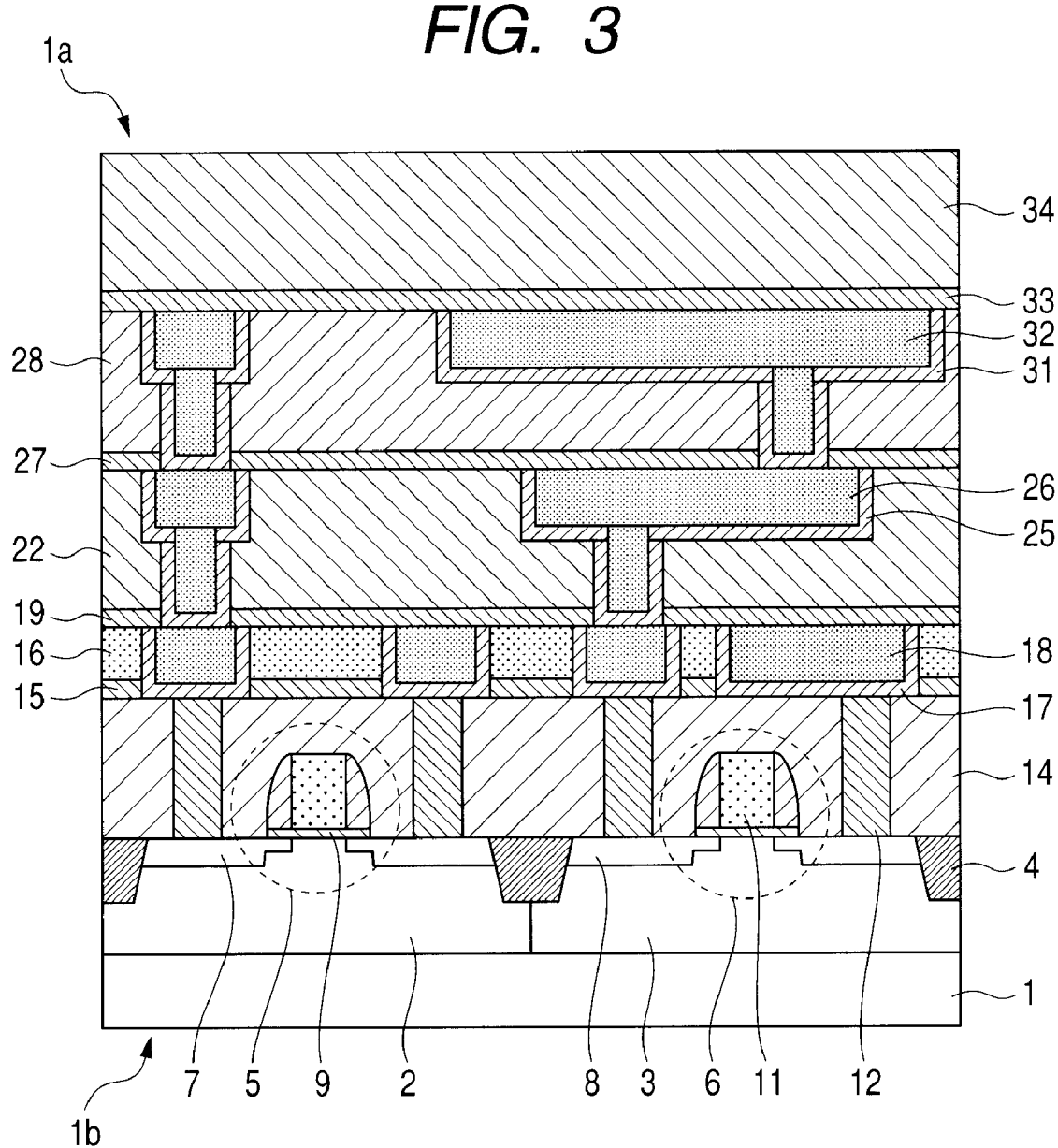
FIG. 3 is a cross-sectional view of the device in the wiring process in the manufacturing method of a semiconductor integrated circuit device according to the one embodiment of the invention (a step of forming an interlayer insulating film of the uppermost-level buried interconnect layer)

As illustrated in FIG. 3, an interlayer insulating film 34 of the uppermost-level (fourth-level) buried interconnect layer is then formed by using, for example plasma CVD. The thickness of the interlayer insulating film 34 is, for example, from about 300 to 400 nm.

Figure 4:
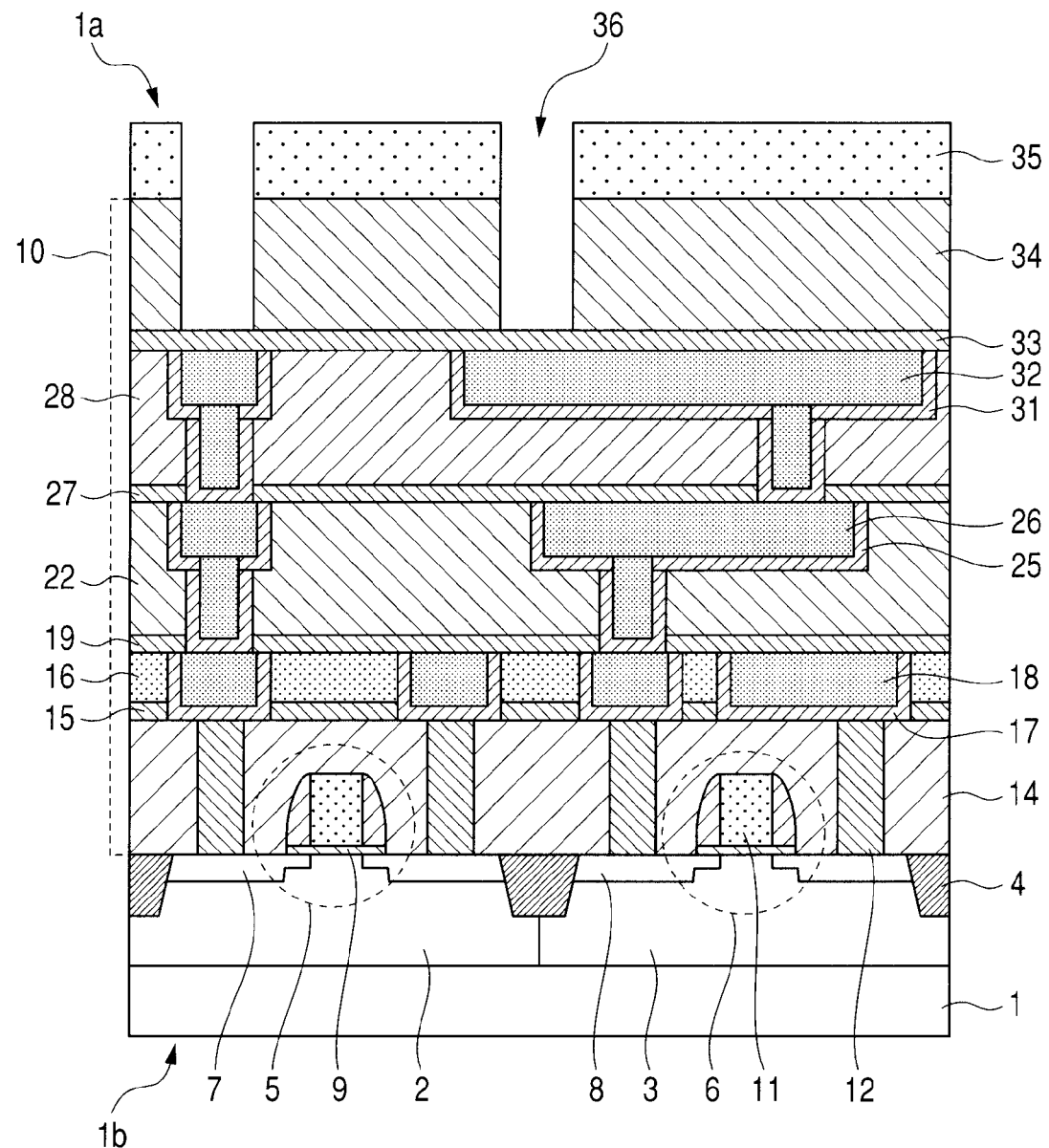
FIG. 4 is a cross-sectional view of the device in the wiring process in the manufacturing method of a semiconductor integrated circuit device according to the one embodiment of the invention (a via etching step in the uppermost-level buried interconnect layer)

As illustrated in FIG. 4, a via-etching resist film 35 is formed on the upper surface of this interlayer insulating film 34 by the process of application (an antireflective film may be formed as a lower layer). The resist film 35 is then patterned by conventional lithography. The device surface 1a side of the wafer is then subjected to dry etching (first dry etching) with the thus-patterned via-etching resist film 35 thereover to form a via hole 36. As a result, toward the lower-level buried interconnect 32 placed in the insulating films 10 over the device surface 1a of the wafer 1, the via hole 36 that extends from the upper surface of the insulating films 10 to the upper surface of the etch stop film 33 over the lower-level buried interconnect 32 and is to be coupled to an upper-level buried interconnect 42 (FIG. 10) is almost formed. The via-etching resist film 35 which becomes unnecessary is then removed.

Figure 5:
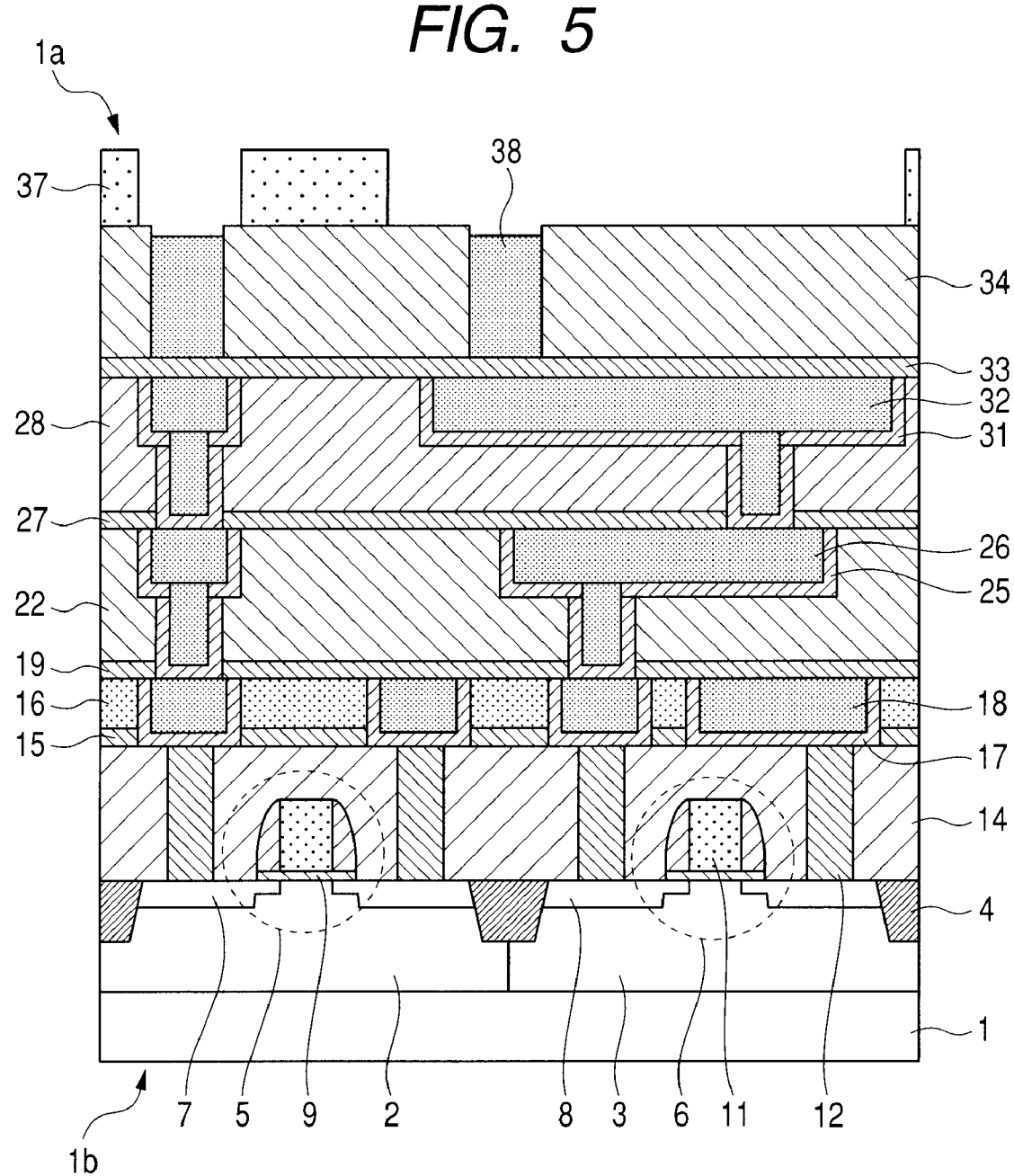
FIG. 5 is a cross-sectional view of the device in the wiring process in the manufacturing method of a semiconductor integrated circuit device according to the one embodiment of the invention (a resist patterning step for trench etching in the uppermost-level buried interconnect layer)

Then, as illustrated in FIG. 5, the via hole 36 is filled with a via-filling coating resist material 38 (formation of a resist plug) and at the same time, a trench etching resist film 37 is formed by the process of application (for example, an antireflective film may be placed as a lower layer between the resist film 37 and a resist material 38), followed by patterning the resist film 38 by using conventional lithography in a similar manner to that described above. Filling of the via hole 36 with the via filling coating resist material 38 is performed, for example, by applying the filling material 38 onto the whole surface and then removing the filling material 38 outside the via hole by using oxygen plasma or the like.

Figure 6:
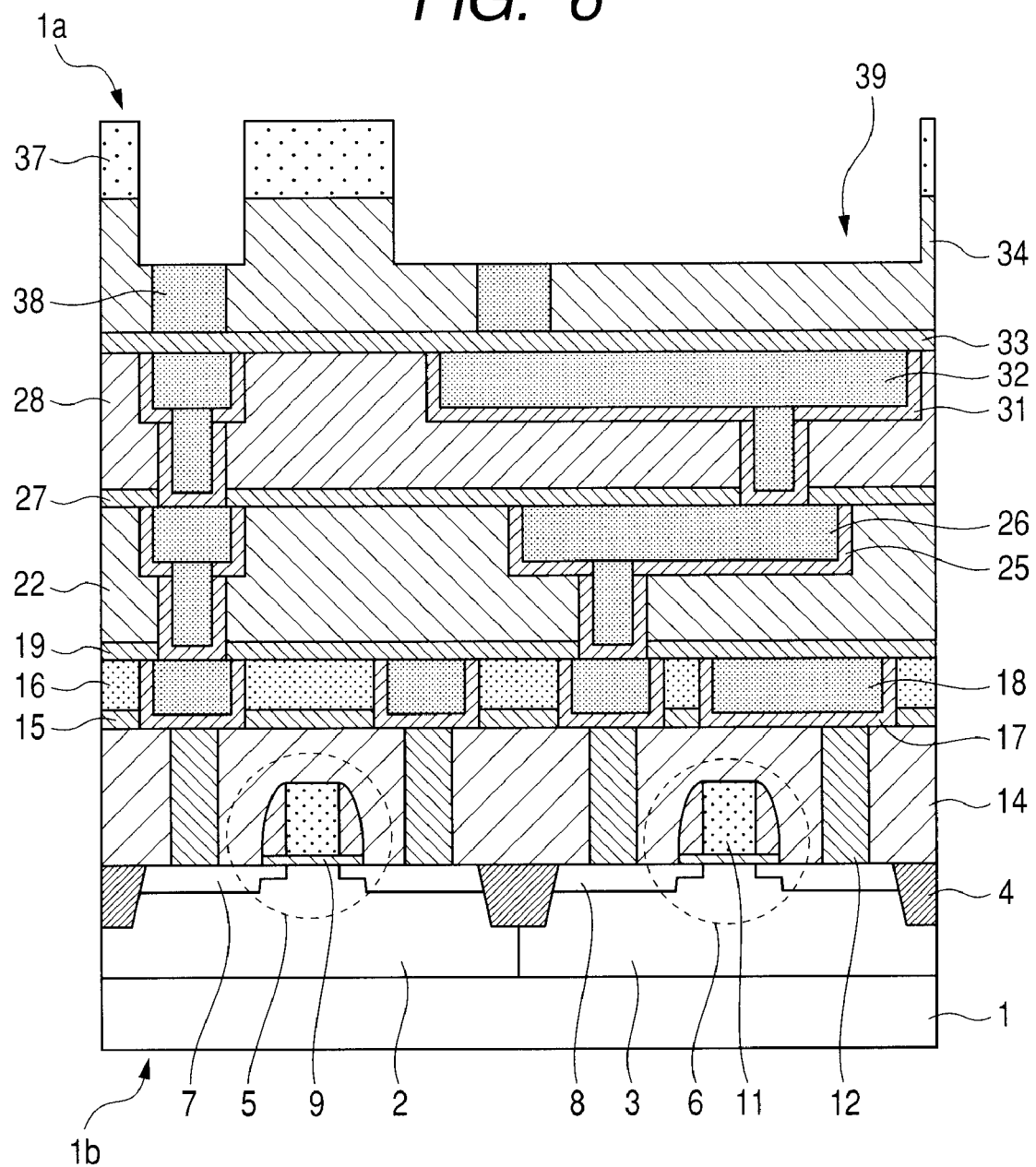
FIG. 6 is a cross-sectional view of the device in the wiring process in the manufacturing method of a semiconductor integrated circuit device according to the one embodiment of the invention (a trench etching step in the uppermost-level buried interconnect layer)

Then, as illustrated in FIG. 6, the wafer 1 on the device surface side 1a is dry etched with the thus-patterned trench etching resist film 37 thereover to form a trench (interconnect trench) 39.

Figure 7:
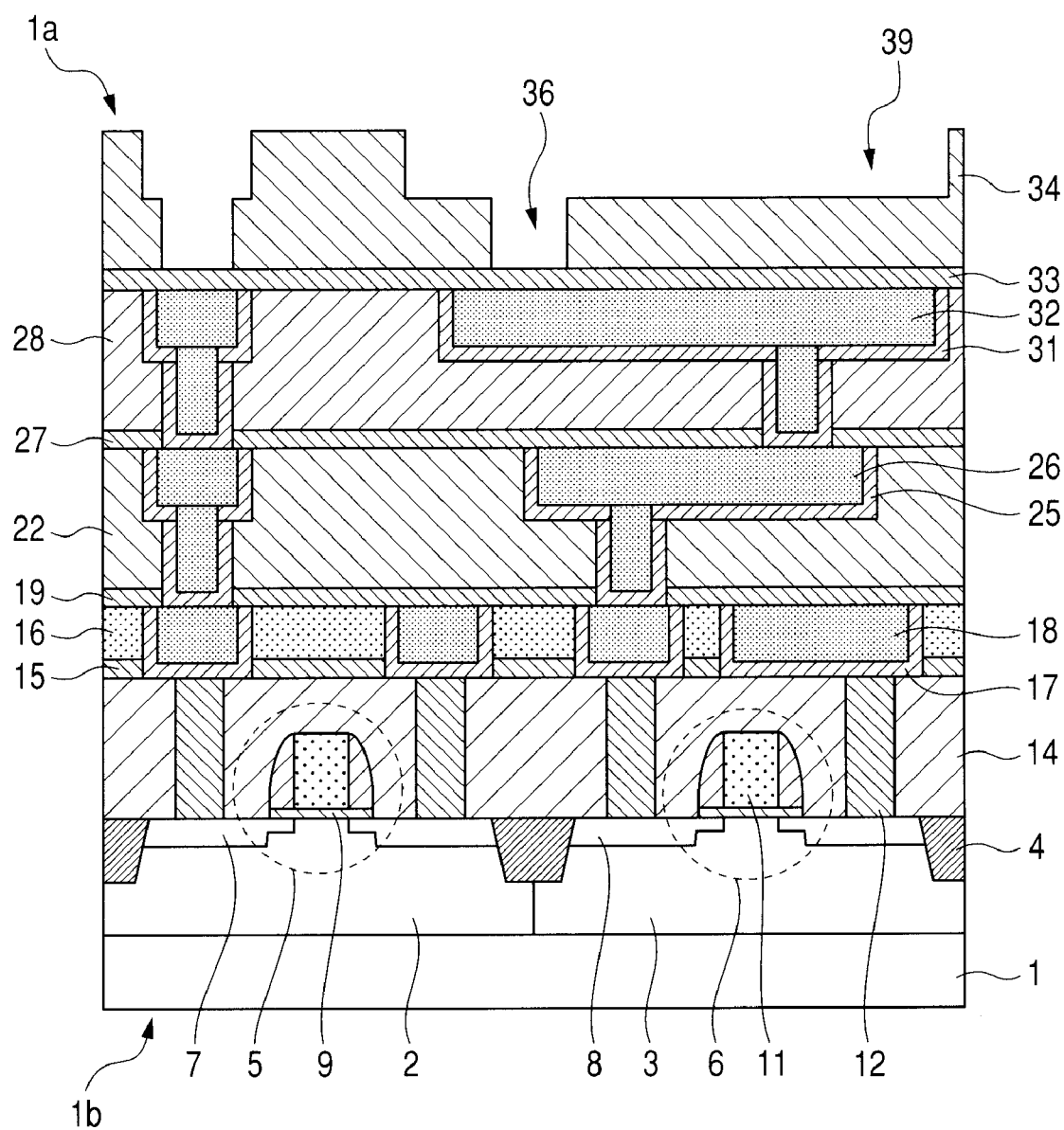
FIG. 7 is a cross-sectional view of the device in the wiring process in the manufacturing method of a semiconductor integrated circuit device according to the one embodiment of the invention (a step of removing the resist after trench etching in the uppermost-level buried interconnect layer)

Then, as illustrated in FIG. 7, the trench etching resist film 37 and the via filling coating resist material 38 are removed because they become unnecessary.

Figure 8:
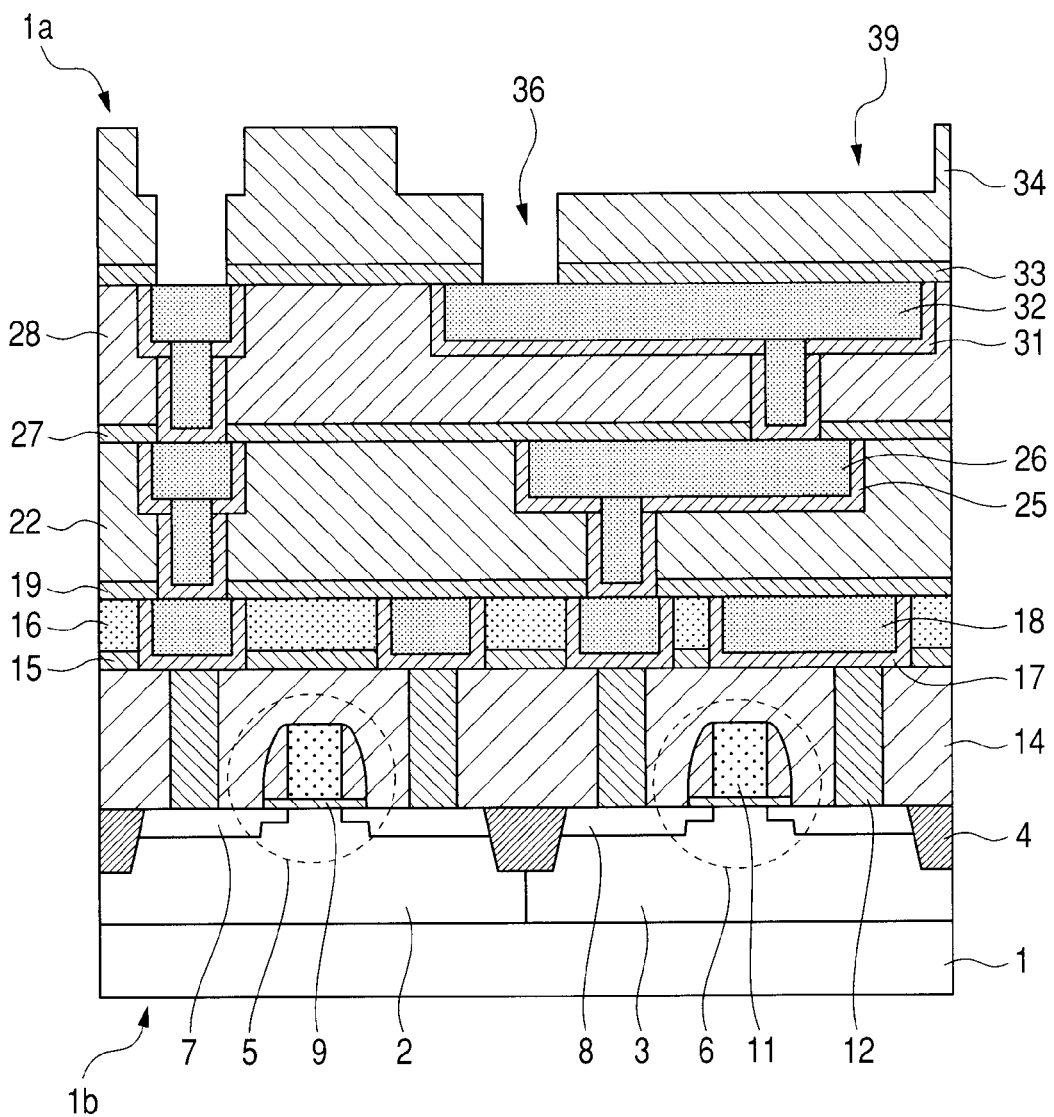
FIG. 8 is a cross-sectional view of the device in the wiring process in the manufacturing method of a semiconductor integrated circuit device according to the one embodiment of the invention (a dry etching step of the etch stop film in the uppermost-level buried interconnect layer)

Then, as illustrated in FIG. 8, the wafer 1 on the device surface 1a side is subjected to dry etching (second dry etching) to extend the via hole 36 to the upper surface of the lower-level buried interconnect 32 (third-level buried interconnect). This means that a penetration hole is formed in the etch stop film 33 of the uppermost-level (fourth-level) buried interconnect layer. This process will be described in detail in the next section.

Figure 9:
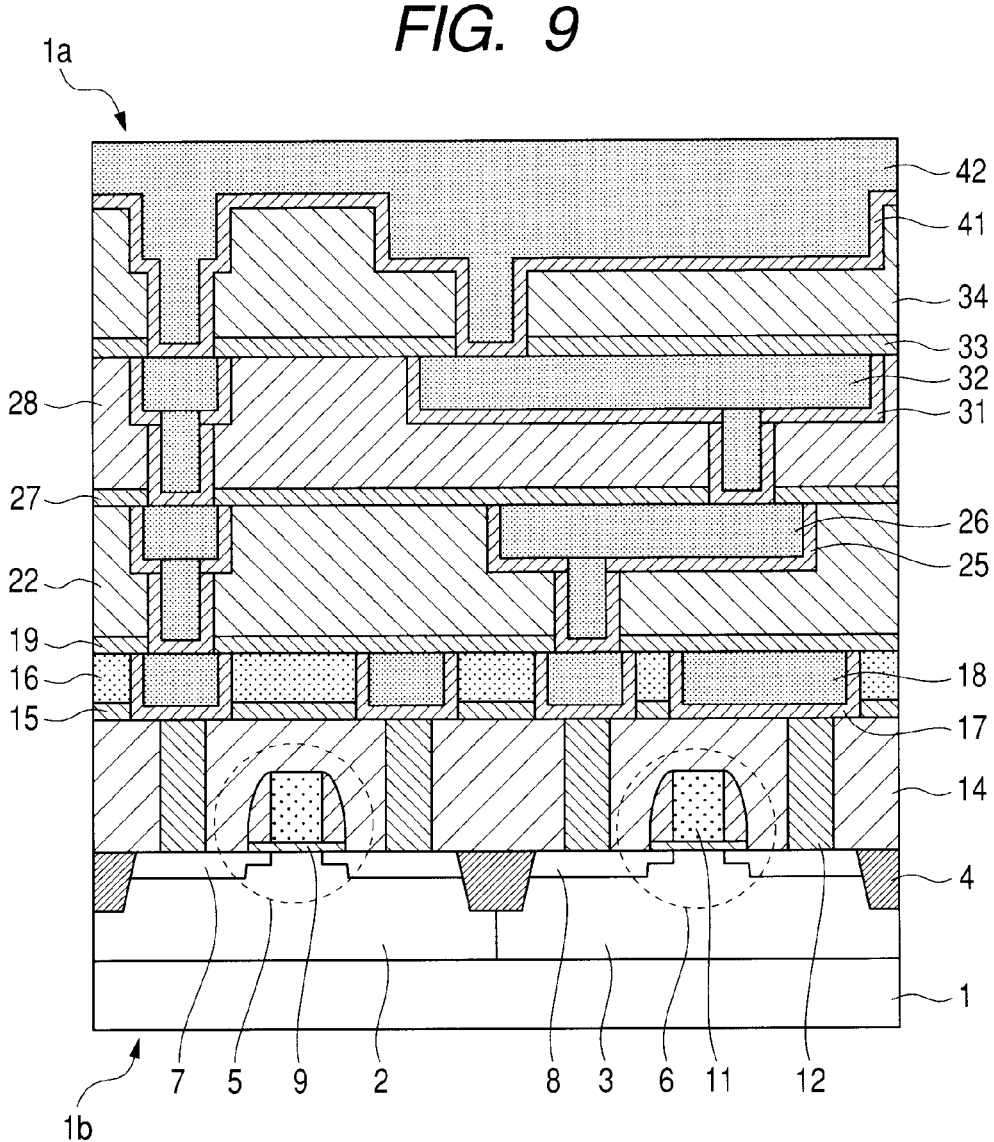
FIG. 9 is a cross-sectional view of the device in the wiring process in the manufacturing method of a semiconductor integrated circuit device according to the one embodiment of the invention (a step of forming a barrier metal film and a copper film in the uppermost-level buried interconnect layer)

Then, as illustrated in FIG. 9, for example, a barrier metal film 41 of the uppermost-level (fourth level) buried interconnect layer is formed using tantalum nitride or the like over the upper surface on the device surface 1a side of the wafer 1 and the inner surfaces of the trench 39 and the via hole 36. Following formation of a copper seed film, an interconnect material 42 having copper as a main component is formed over the upper surface on the device surface 1a side of the wafer 1 and filled inside of the trench 39 and the via hole 36 by electroplating or the like method.

Figure 10:
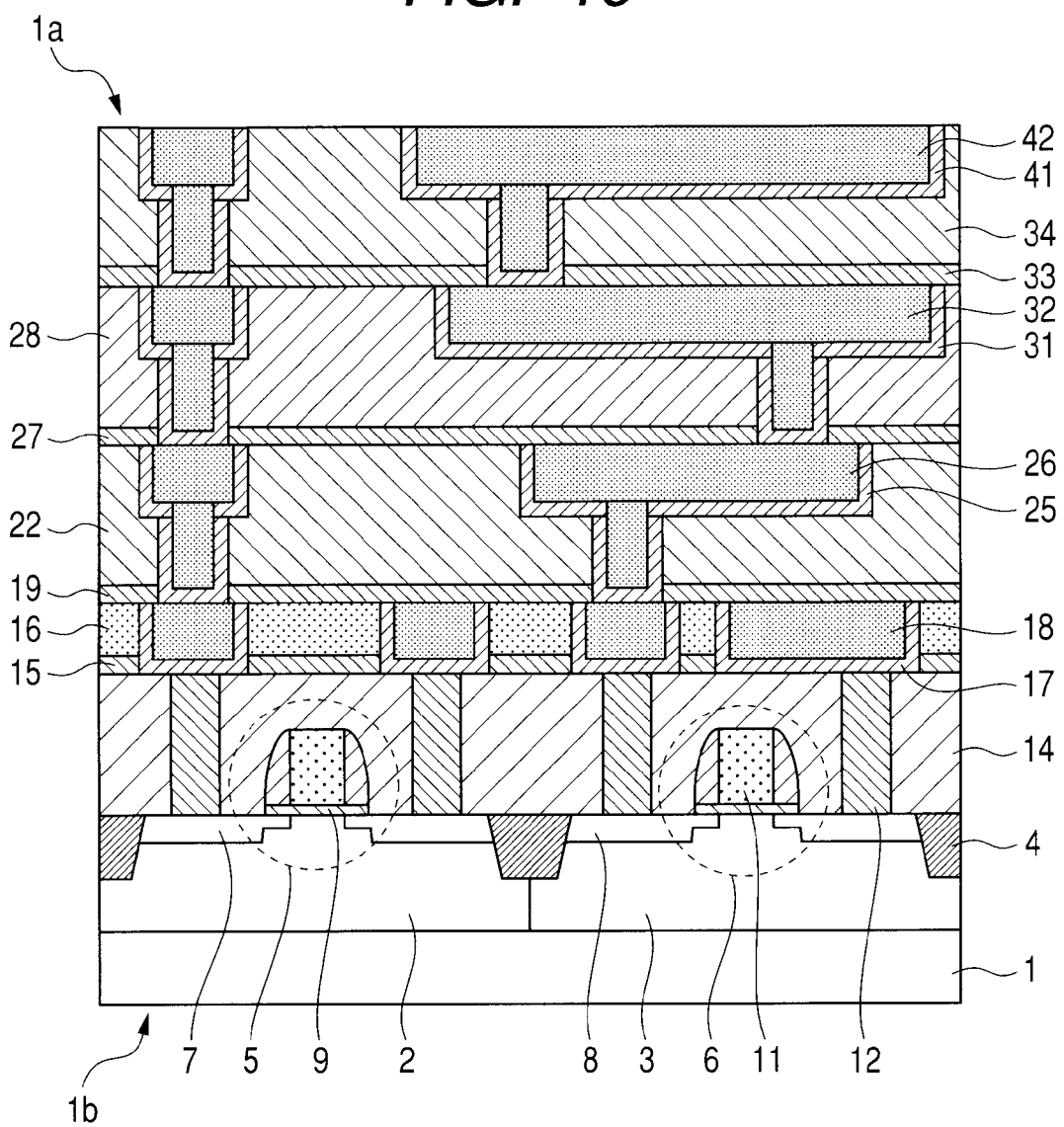
FIG. 10 is a cross-sectional view of the device in the wiring process in the manufacturing method of a semiconductor integrated circuit device according to the one embodiment of the invention (a step of carrying out metal CMP in the uppermost-level buried interconnect layer)

Then, as illustrated in FIG. 10, the interconnect material 42 outside the trench 39 and the via hole 36, and the barrier metal film 41 are removed by metal CMP or the like method, by which the uppermost-level (fourth level) buried interconnect 42 is formed. The interconnect pitch of the uppermost-level (fourth level) buried interconnect 42 is, for example, about 400 nm.

Figure 11:
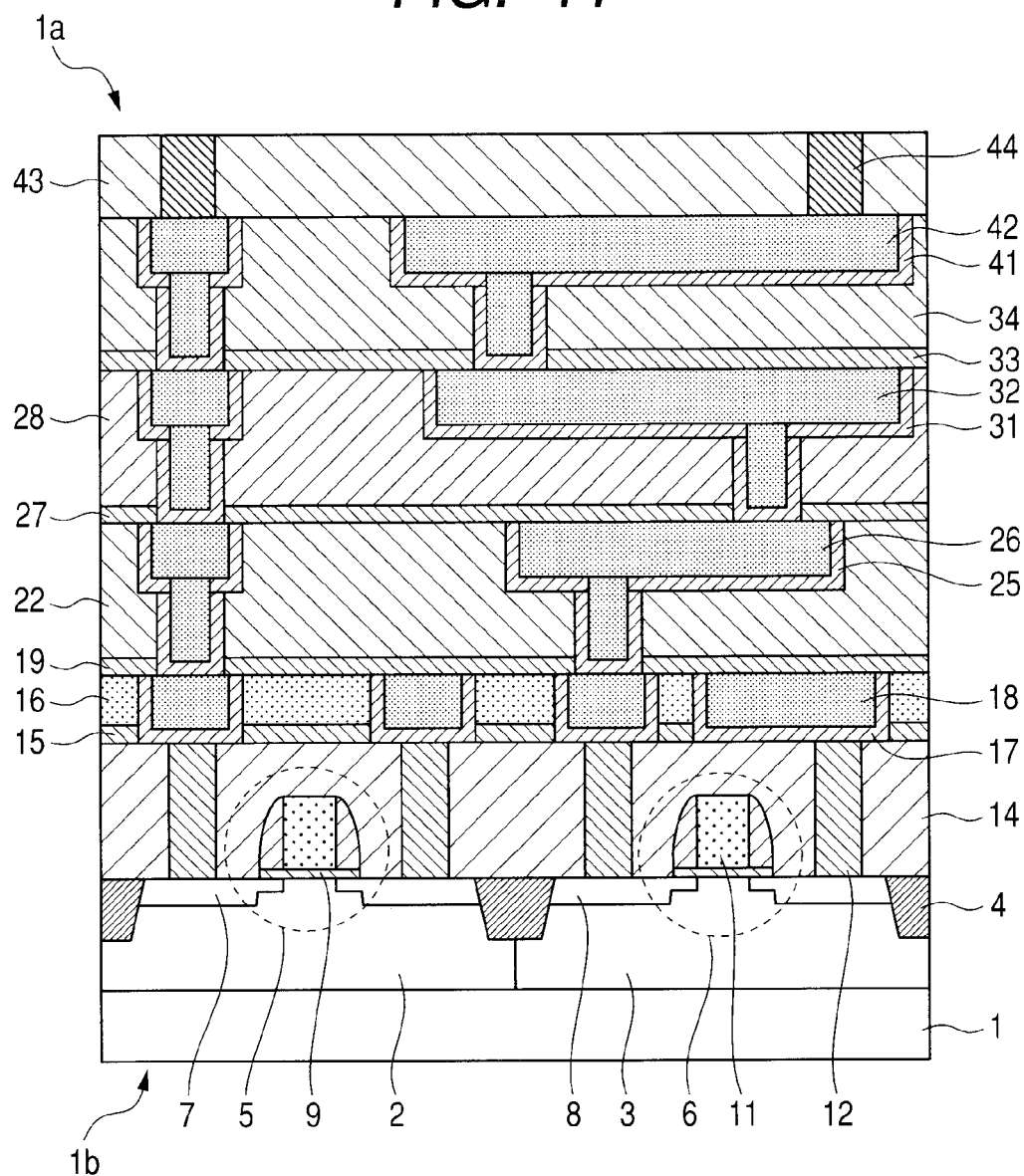
FIG. 11 is a cross-sectional view of the device in the wiring process in the manufacturing method of a semiconductor integrated circuit device according to the one embodiment of the invention (a step of forming an insulating film lying below an aluminum-based pad and a tungsten plug)

Then, as illustrated in FIG. 11, over the interlayer insulating film 34 of the uppermost-level (fourth-level) buried interconnect layer, an insulating film 43 lying below an aluminum-based pad is formed and it is filled with a tungsten plug 44 lying below the aluminum pad so that the plug penetrates through the insulating film.

Figure 12:
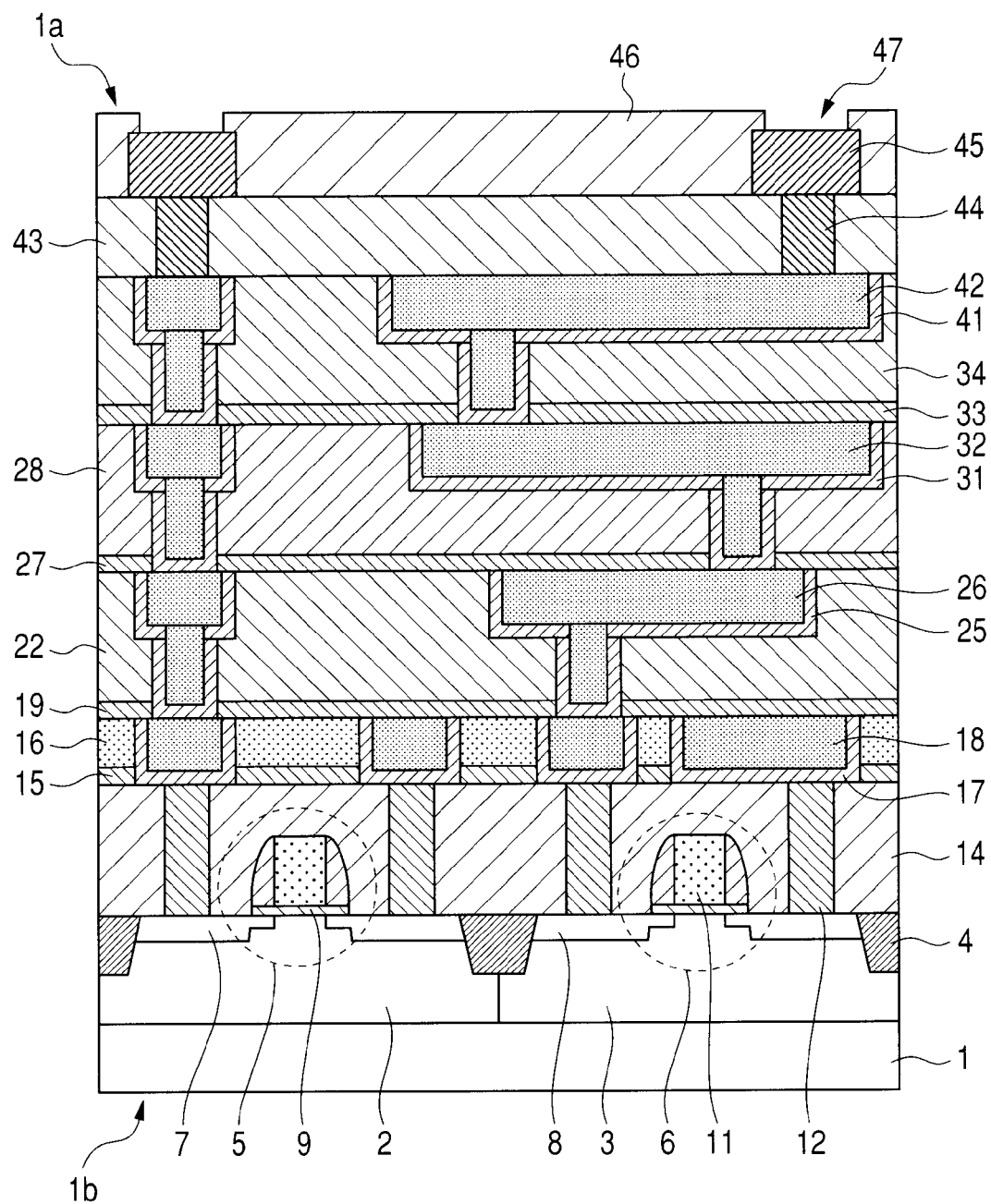
FIG. 12 is a cross-sectional view of the device in the wiring process in the manufacturing method of a semiconductor integrated circuit device according to the one embodiment of the invention (a step of forming the aluminum-based pad, a final passivation film, and a pad opening)

Then, as illustrated in FIG. 12, an aluminum-based metal film 45 (conventionally, a metal multilayer film structure) is formed over the insulating film 43 lying below an aluminum-based pad by, for example, sputtering. The resulting aluminum-based metal film 45 is patterned by conventional lithography to form an aluminum-based pad electrode 45. Then, a final passivation film 46 is formed, for example, by plasma CVD over the insulating film 43 lying below the aluminum-based pad and the aluminum-based pad electrode 45. Then, a pad opening 47 is made over the aluminum-based pad electrode 45 by patterning using conventional lithography.

2. Description on the detailed process of dry etching of etch stop films of the uppermost-level buried interconnect layer and one example of an apparatus used therefor in the manufacturing method of a semiconductor integrated circuit device (copper-based buried wiring structure) according to the one embodiment of the invention (referring to mainly FIGS. 13 to 17).

This section describes details of the removing step (after the resist removal of FIG. 7 but prior to the formation of the barrier metal film of FIG. 9) of the etch step film 33 of the uppermost-level (fourth-level) buried interconnect layer as described in the previous section based on FIG. 8 and the outline of the structure of a gas phase treatment apparatus 51 having a dry etching chamber 52 to be used for dry etching or the like.

Figure 14:
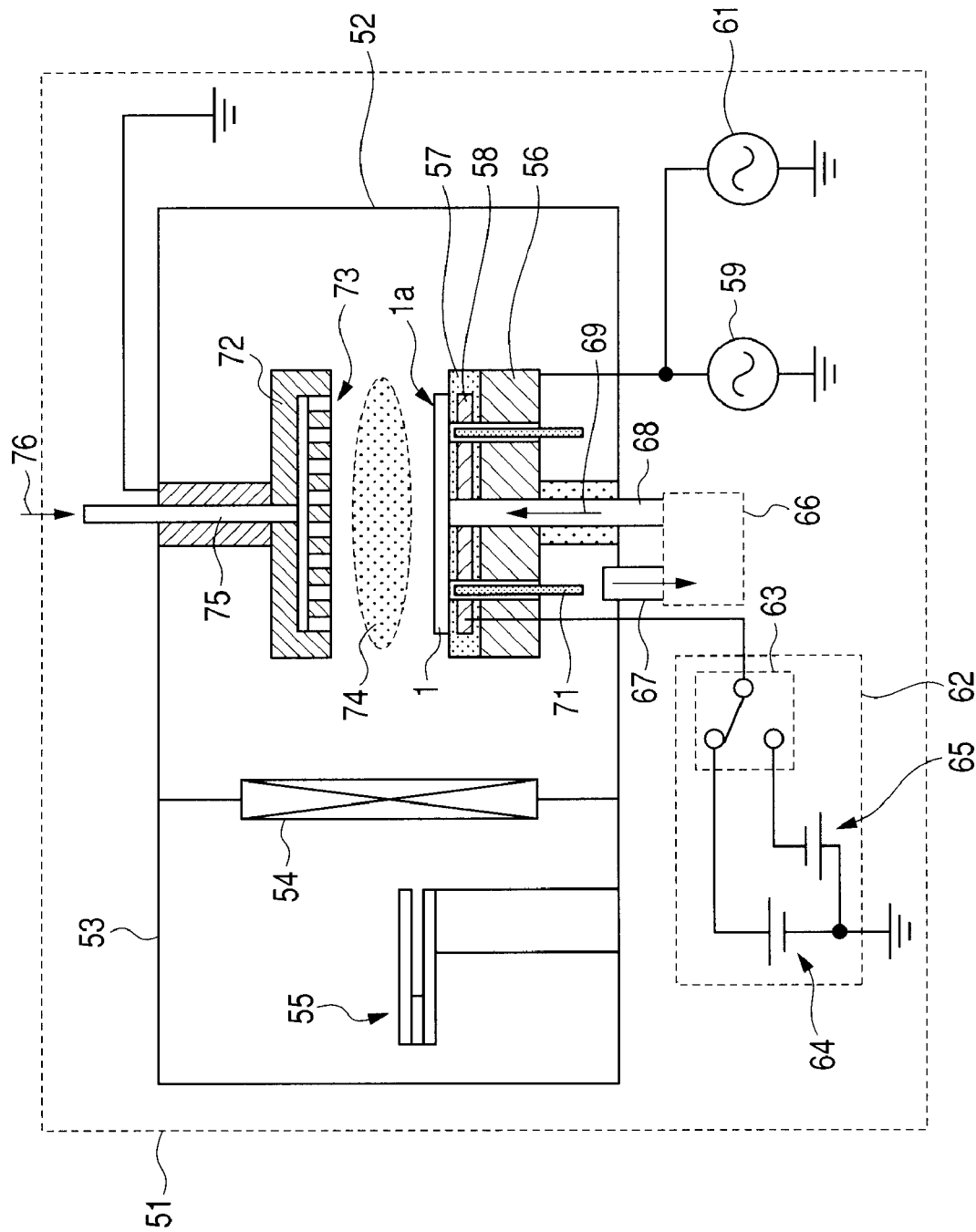
FIG. 14 is a schematic cross-sectional view of a dry etching apparatus corresponding to the dry etching step of the etch step film and the subsequent nitrogen plasma treatment step shown in FIG. 13.

First, as illustrated in FIG. 14, a wafer having a diameter of 300 φ is usually housed in a wafer transfer container called "Foup", which is coupled to a load port of a gas phase treatment apparatus 51 (which may be a multi-chamber apparatus or the like). The wafer 1 to be treated is transferred by means of a transfer robot or the like to a vacuum transfer robot 55 in a vacuum transfer chamber 53 after being allowed to pass through an atmospheric pressure cleaning chamber and a load lock chamber of the apparatus 51. When a wafer load/unload gate 54 opens, the wafer 1 is introduced into the dry etching chamber 52 by means of the vacuum transfer robot 55 and placed on a wafer lift pin 71 protruding from a wafer stage 57. After the vacuum transfer robot 55 retreats and the wafer load/unload gate 54 closes, the wafer lift pin 71 descends and the wafer 1 is placed over the wafer stage 57.

The wafer stage 57 described above has, inside the wafer stage 57 made of ceramics, an electrostatic chuck electrode 58 so that the stage 57 will function as an electrostatic chuck. The electrostatic chuck electrode 58 is coupled to an electrostatic chuck control system 62 and the electrostatic chuck control system 62 has inside thereof a DC power source 64 (for example, +1050 volt) for electrostatic adsorption, a DC power source 65 (for example, from minus 50 to 100 volt) for removal of electrostatic charge, an electrostatic chuck control switch 63, and the like. The electrostatic chuck 57 is fixed onto the upper surface of a lower electrode 56. To this lower electrode 56, an RF power source (2 MHz) 59 and an RF power source (27 MHz) 61 for exciting plasma 74 can be coupled (one or both of these power sources can be coupled to the lower electrode by switching). To the back surface of the wafer 1, a helium gas (cooling gas 69) for cooling can be supplied via a cooling gas supply pipe 68 that penetrates through the wafer stage 57. This helium gas (cooling gas 69) for cooling is supplied to a groove (for example, about 1 mm wide) formed on the surface of the electrostatic chuck 57 and the cooling effect of the back surface 1b of the wafer 1 can be heightened by filling a helium gas (cooling gas 69) for cooling in a region closed with the groove portion and the back surface 1b of the wafer 1. The dry etching chamber 52 has therebelow a treatment chamber exhaust pipe 67. Exhaust of the dry etching chamber 52 via this treatment chamber exhaust pipe 67 and supply and exhaust of the cooling gas 69 via the cooling gas supply pipe 68 are controlled by a treatment chamber exhaust & cooling gas supply system 66.

An upper electrode 72 is placed opposite to the device surface 1a of the wafer 1 thus placed on the wafer stage. This upper electrode 72 is grounded. The upper electrode 72 has, at the lower portion thereof, a shower head 73 to which an atmospheric gas 76 is supplied via an atmospheric gas supply pipe 75.

Steps including a step of removing an etch stop insulating film will next be described in detail in accordance with the flow chart of FIG. 13. As illustrated in FIG. 14, when the DC power source 64 for electrostatic adsorption turns ON, the back surface 1b of the wafer 1 is electrostatically adsorbed to the wafer stage 57. When plasma 74 is generated (plasma lighting) under such a state, a dry etching step 101 (FIG. 13) of the etch stop insulating film starts (etching time is, for example, about 1 minute). From the shower head 73, for example, a mixed etching gas having $CF_4$, $CHF_3$, $N_2$ and the like as main components is supplied (flow rates of $CF_4$, $CHF_3$, and $N_2$ are, for example, 100 sccm, 25 sccm, and 250 sccm, respectively) during this etching step 101. The pressure of the dry etching chamber 52 is kept at, for example, from 20 to 30 Pa. At this time, the cooling gas 69 is supplied to the back surface 1b of the wafer 1 through the cooling gas supply pipe 68 (supply pressure is, for example, about 4 kPa). The temperature of the lower electrode 56 is controlled by means of a temperature control chiller (temperature control cooler), which is not illustrated in the drawing, and the preset temperature is, for example, about 40° C. With respect to the output of a high-frequency power source, the outputs of an RF power source (2 MHz) 59 and an RF power source (27 MHz) 61 are, for example, from about 100 to 300 watts, respectively. After completion of the dry etching step 101 of an etch step insulating film (FIG. 13), a nitrogen plasma treatment step 102 (FIG. 13) is performed without changing the conditions.

As illustrated in FIG. 14, the high-frequency power sources turn OFF (both high frequency power sources turn OFF), the plasma 74 disappears (plasma extinction), and the gas atmosphere is replaced with an atmosphere having a nitrogen gas as a main component. Under such a state, when the RF power source (27 MHz) 61 turns ON and the plasma 74 is generated (plasma lighting), a nitrogen plasma treatment step 102 (FIG. 13) is started (treatment time is, for example, about 20 seconds). The pressure of the dry etching chamber 52, supply pressure of the cooling gas 69, and the like are almost the same as those of the previous step. The output of the high frequency power sources is, for example, from about 400 to 600 watts (for example, about 500 watts). The flow rate of the nitrogen gas is, for example, about 400 sccm. The electrostatic chuck is still working. This nitrogen plasma treatment step 102 (FIG. 13) is effective in a via-bottom formation step in a Cu damascene multilayer wiring structure and has an effect for suppressing generation of a carbon residue on the via-bottom surface. Completion of the nitrogen plasma treatment step 102 (FIG. 13) is followed by a step 103 (FIG. 13) of removing electrostatic charge by using argon plasma under the same condition (with plasma ON).

Figure 15:
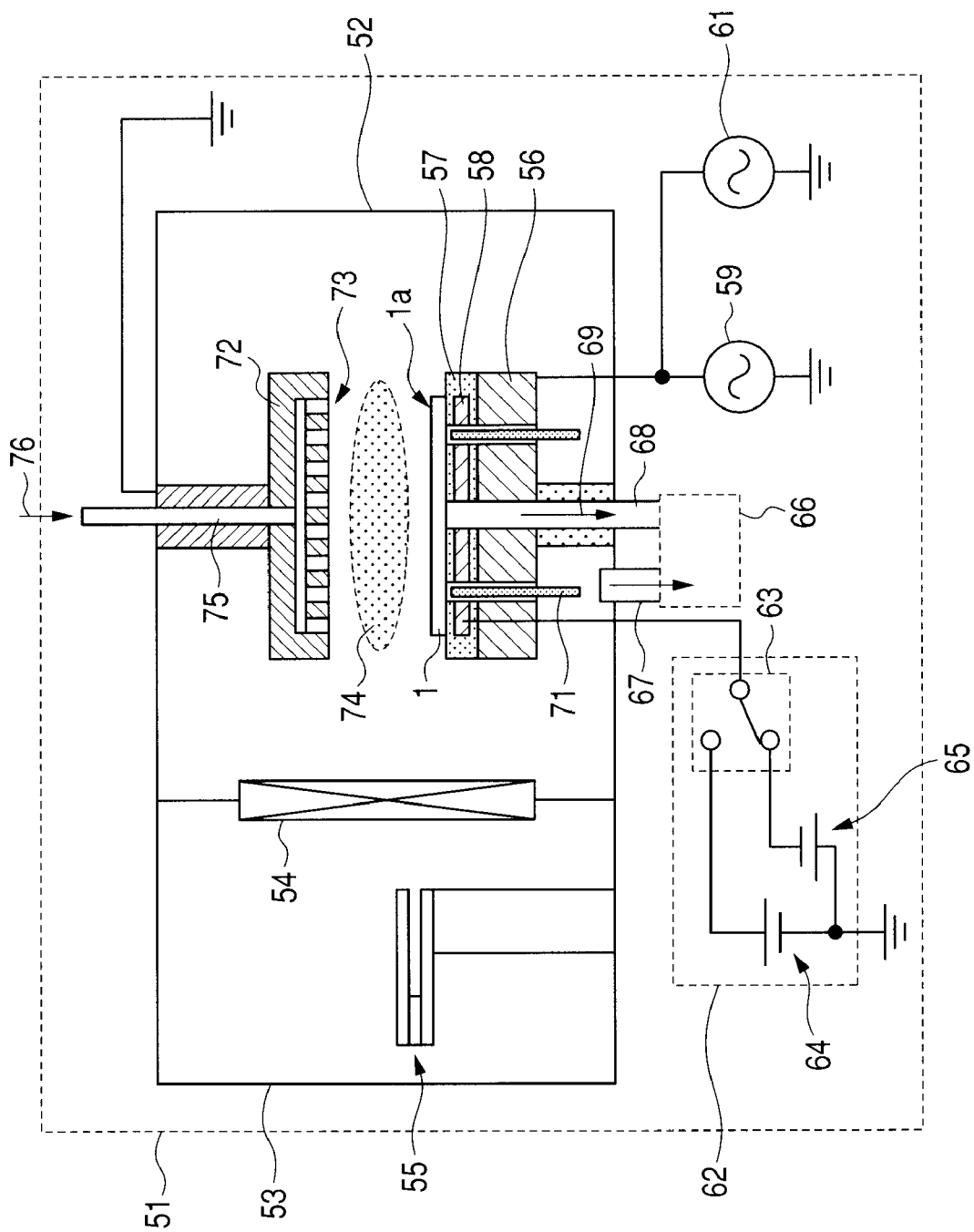
FIG. 15 is a schematic cross-sectional view of the dry etching apparatus corresponding to the step of removing electrostatic charge by using argon plasma after the nitrogen plasma treatment step shown in FIG. 13.

As illustrated in FIG. 15, the atmospheric gas 76 is changed from a gas having nitrogen as a main component to a gas having argon as a main component. When the plasma 74 is replaced with argon plasma, a step 103 (FIG. 13) of removing electrostatic charge by using argon plasma starts. The flow rate of the atmospheric gas 76 having argon as a main component is, for example, about 1000 sccm. The output of the RF power source (27 MHz) 61 is, for example, about from 50 to 60 watts. The pressure of the treatment chamber 52 is from about 5 to 15 Pa (for example, 10 Pa). As illustrated in FIG. 15, on the other hand, the electrostatic chuck control switch 63 is switched and the DC power source 65 for removing electrostatic charge turns ON so that the electrostatic chuck 67 rather functions to release the wafer 1 or remove electrostatic charge therefrom. At this time, the pressure of the cooling gas 69 supplied to the back surface 1b of the wafer 1 through the cooling gas supply pipe 68 is reduced to, for example, from about 4 kPa to 1 kPa. The cooling gas 69 has a flow opposite to that in the nitrogen plasma treatment step 102 (negative pressure or suction state) so that the back surface 1b of the wafer 1 is closely attached to the upper surface of the wafer stage 57. The treatment time of the step 103 (FIG. 13) of removing electrostatic charge by using argon plasma is, for example, from about 10 to 20 seconds (for example, 15 seconds). Completion of the step 103 (FIG. 13) of removing electrostatic charge by using argon plasma is followed by a wafer release step 104 (FIG. 13) without changing the conditions.

Figure 16:
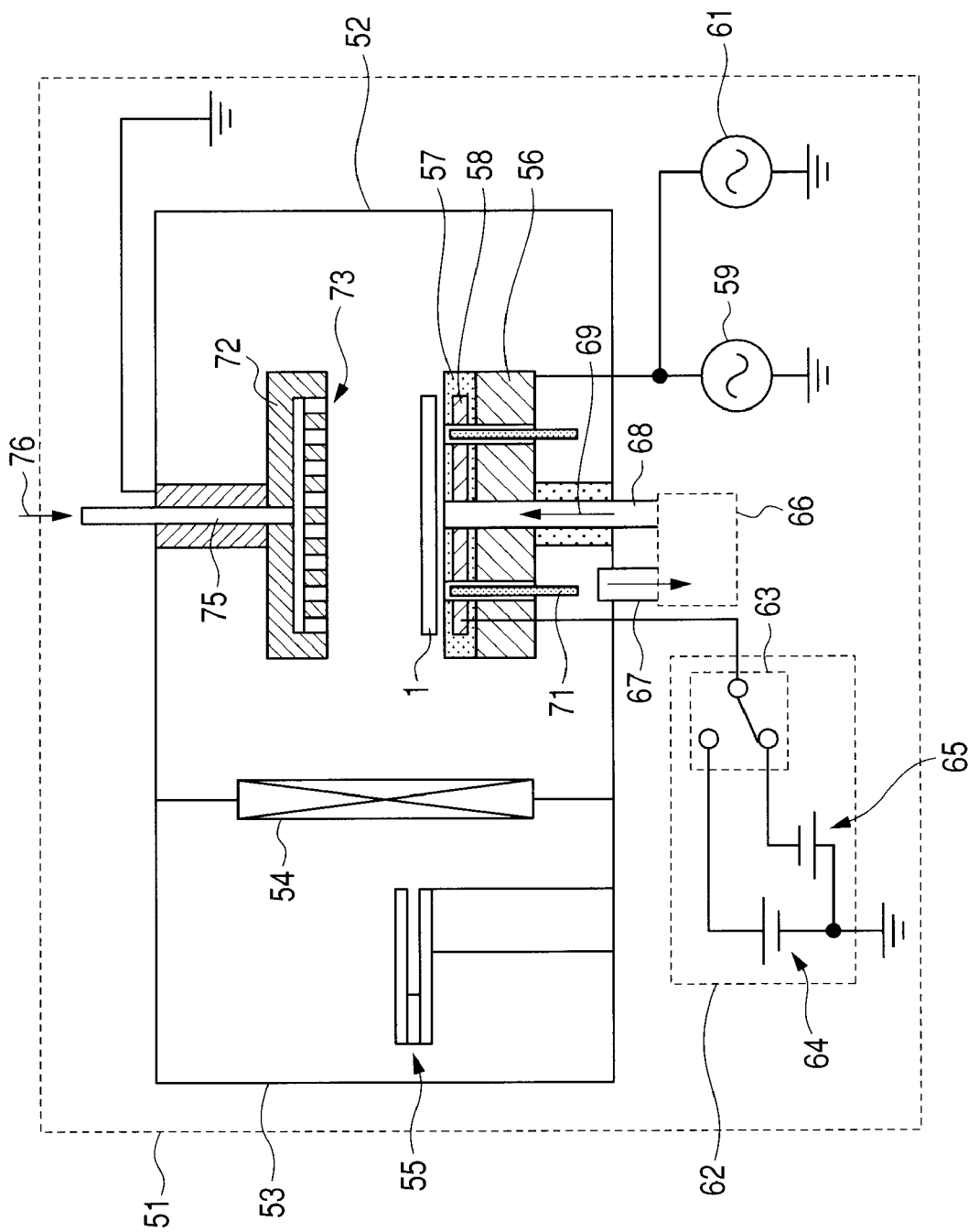
FIG. 16 is a schematic cross-sectional view of the dry etching apparatus corresponding to the wafer release step after the step of removing electrostatic charge by using argon plasma shown in FIG. 13.

As illustrated in FIG. 16, the output of the RF power source (27 MHz) 61 becomes zero, the plasma 74 disappears, and the cooling gas 69 is supplied from the cooling gas supply pipe 68

Figure 17:
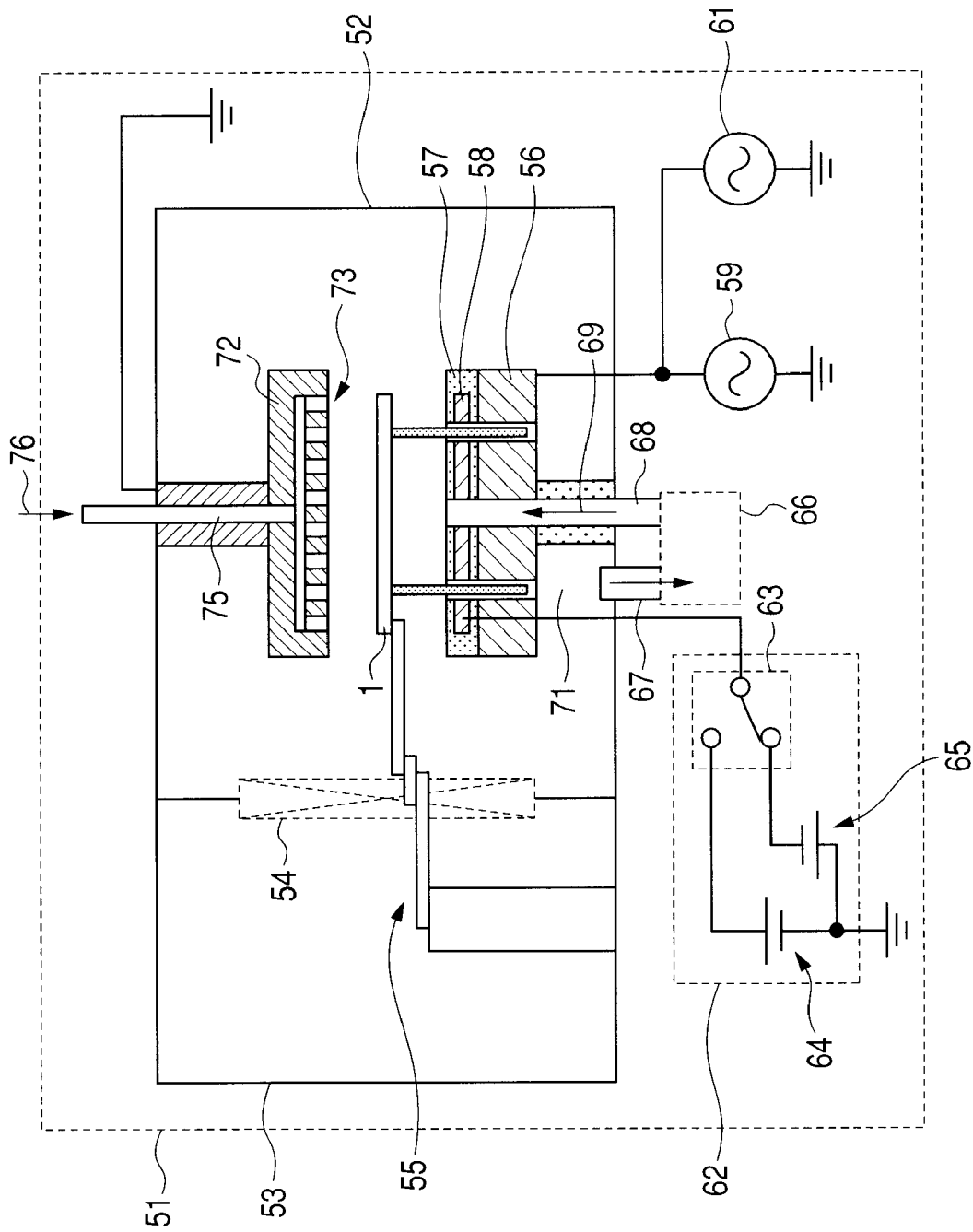
FIG. 17 is a schematic cross-sectional view of the dry etching apparatus corresponding to the wafer unloading step after the wafer release step shown in FIG. 13.

(for example, pressure applied to the wafer back surface is from about 0.6 to 0.7 kPa), which drastically reduces the adhesion force between the back surface $1b$ and the upper surface of the wafer stage 57. With the reduction in adhesion force, the adhesion between the back surface $1b$ of the wafer 1 and the upper surface of the wafer stage 57 is released to form a gap therebetween. In order to keep the wafer back-surface pressure at from about 0.6 to 0.7 kPa, a supply amount of the cooling gas 69 from the cooling gas supply pipe 68 increases rapidly. Completion of removal of electrostatic charge is determined based on an increase in the supply amount of the cooling gas 69 to a certain threshold value or greater. This step is necessary for preventing wafer breakage which will otherwise occur when transition to a wafer release operation occurs in spite of insufficient removal of electrostatic charge and the wafer lift pin 71 is lifted up. The supply amount of the cooling gas 69 not less than the certain threshold value, which amount serves as a criterion for judging removal of electrostatic charge, corresponds to a supply amount of the cooling gas 69 when the cooling gas 69 is supplied from the cooling gas supply pipe 68 to the upper surface of the wafer stage 57 having no wafer 1 thereon at a wafer back-surface pressure of from about 0.6 to 0.7 kPa. The release step 104 (FIG. 13) of the wafer 1 is substantially completed here. Then, as illustrated in FIG. 17, the wafer lift pin 71 rises to lift up the wafer 1. Under such a state, the wafer load/unload gate 54 opens, and the vacuum transfer robot 55 enters from the gate and transfers the wafer 1 from on the wafer lift pin 71 to the vacuum transfer chamber 53, by which the wafer unloading step 105 is completed. Then the wafer 1 is housed in FOUP or the like again and carried in a wet treatment apparatus outside the gas phase treatment apparatus or a wet treatment chamber therein (referred to as a wet treatment apparatus or the like).

Then, a wet cleaning step 106 (FIG. 13) is performed in the wet treatment apparatus or the like. The wet cleaning step 106 (FIG. 13) is not essential but is effective for removing a carbon residue from the via-bottom surface. As a cleaning solution, an aqueous solution having, for example, γ-butyrolactone ($C_4H_6O_2$), $NH_4F$, or the like as a main component can be used. In this case, it is preferred that the temperature of the cleaning solution is, for example, from room temperature to about 40° C. and the cleaning time is from about 3 minutes to 5 minutes.

3. Description on a data plot graph for comparing the electrostatic-charge removal method in the manufacturing method of a semiconductor integrated circuit device (copper-based buried wiring structure) according to the one embodiment of the invention and another electrostatic-charge removal method and describing the principle of electrostatic charge removal by using argon (mainly from FIGS. 18 to 20).

Figure 13:
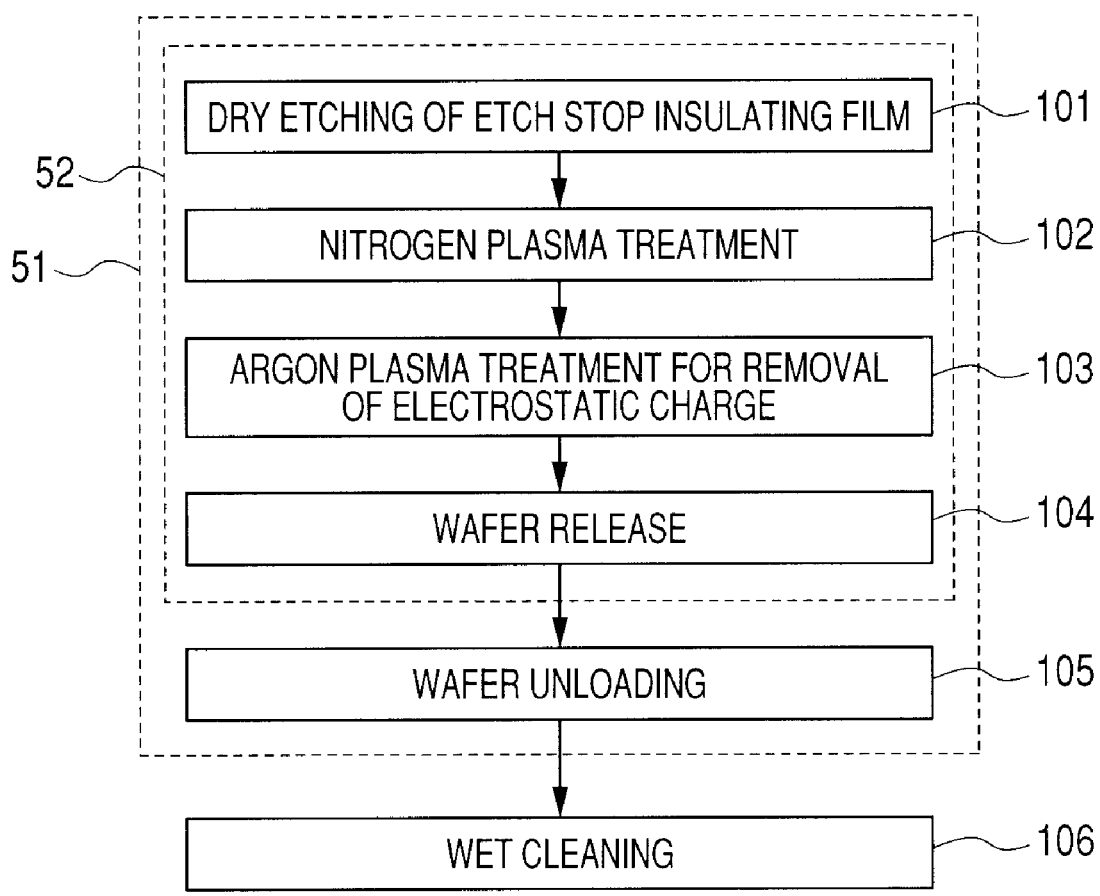
FIG. 13 is a detailed process block flow chart including the dry etching step of the etch stop film shown in FIG. 8.
Figure 18:
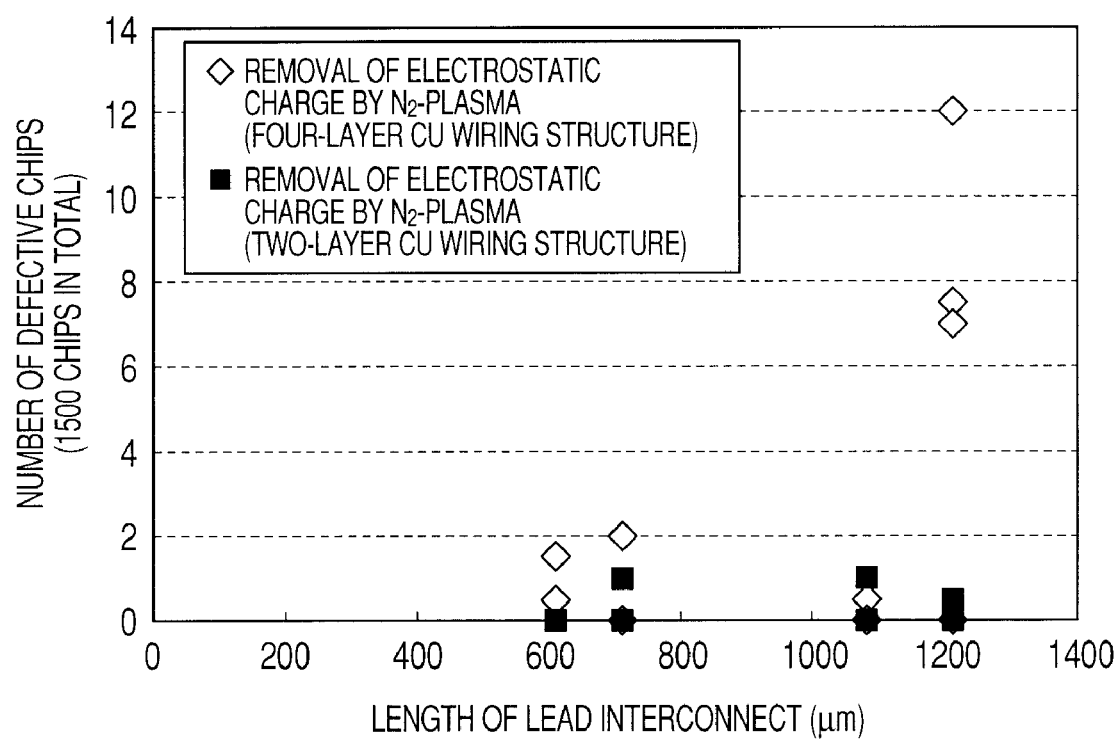
FIG. 18 is a data plot graph showing, as a comparison example, the relationship between via-bottom conduction failures of the uppermost-level copper interconnect layer and the length of an lead interconnect (the shortest path length along the upper-most level copper interconnect from the via position of the interconnect to the bottom of the pad) in two-layer and four-layer copper buried wiring structures when electrostatic charge is removed by using plasma in a nitrogen atmosphere.

FIG. 18 is a data plot graph showing the relationship between via-bottom conduction failures of the uppermost-level copper interconnect layer and length of a lead interconnect (shortest path length extending along the uppermost-level copper interconnect from the via position thereof to the bottom of the pad) in two-layer and four-layer copper buried wiring structures when electrostatic charge is removed using plasma in a nitrogen atmosphere after the nitrogen plasma treatment 102 (FIG. 13) instead of the argon plasma treatment for removal of electrostatic charge 103 (FIG. 13).

The results of the graph have revealed that the via-bottom conduction failures increase rapidly when the number of lower-level buried interconnects increases to three. This means that via-bottom conduction failures occur frequently at the via bottom (in the vicinity of the upper surface of the third-level buried interconnect which corresponds to the via bottom) of the buried interconnect in which the uppermost-level is a fourth level or higher. In addition, it can be understood that the failures increase rapidly when the length of a lead interconnect exceeds 1000 μm.

Figure 19:
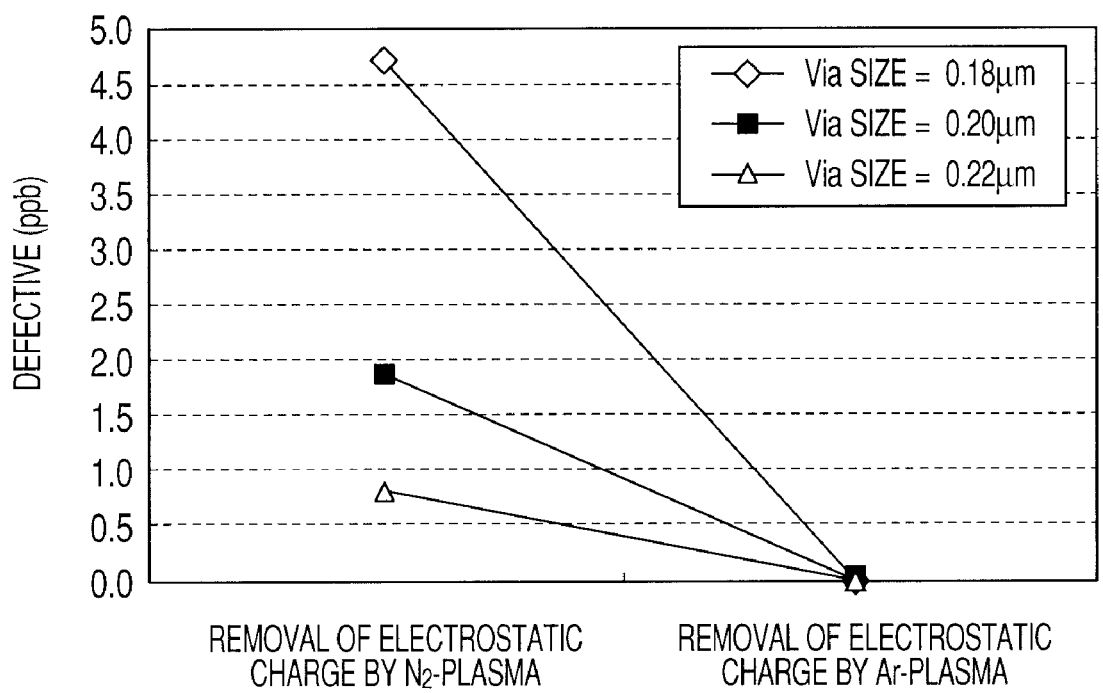
FIG. 19 is a data plot graph for comparison showing the relationship of via-bottom conduction failures between when electrostatic charge is removed by using plasma in a nitrogen atmosphere and when electrostatic charge is removed by using plasma in an argon atmosphere, each performed as a measure against via-bottom conduction failures of the uppermost-level copper interconnect layer in the four-layer copper buried wiring structure.

FIG. 19 is a comparison data plot graph showing the relationship in electrostatic-charge removal between use of plasma in a nitrogen atmosphere and use of plasma in an argon atmosphere as a measure against via-bottom conduction failures of the uppermost-level copper interconnect layer of the four-layer copper buried wiring structure. Effectiveness of electrostatic-charge removal by using plasma in an argon atmosphere can be confirmed clearly. It can also be found from a via-size dependence of the defective ratio in the electrostatic-charge removal by using plasma in a nitrogen atmosphere that the via-bottom conduction failures in this mode increase rapidly when the via size is about 1.8 μm or less.

Figure 20:
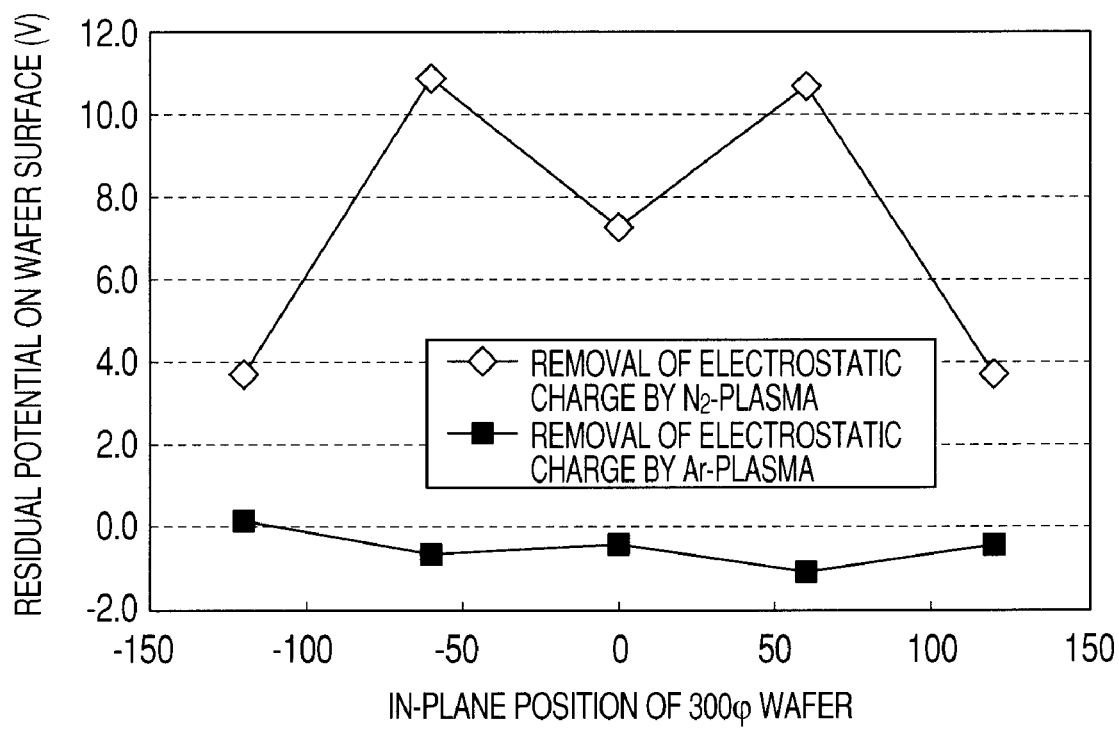
FIG. 20 is a data plot graph showing the relationship of the potential distribution on the device surface of the wafer between when electrostatic charge is removed by using plasma in a nitrogen atmosphere and when electrostatic charge is removed by using plasma in an argon atmosphere, each performed as a measure against via-bottom conduction failures of the uppermost-level copper interconnect layer in the four-layer copper buried wiring structure.

FIG. 20 is a data plot graph showing the relationship of the potential distribution on the device surface of the wafer between when electrostatic charge is removed by using plasma in a nitrogen atmosphere and when electrostatic charge is removed by using plasma in an argon atmosphere, each performed as a measure against via-bottom conduction failures of the uppermost-level copper interconnect layer in the four-layer copper buried wiring structure. It can be found from the results that electrostatic charge is removed sufficiently from the wafer surface and the potential distribution becomes flat in the removal of electrostatic charge by using plasma in an argon atmosphere, while the electrostatic charge is not removed sufficiently and the potential distribution has large unevenness in the removal of electrostatic charge by using plasma in a nitrogen atmosphere. This suggests that the nitrogen plasma has an action of stabilizing the surface of a silicon oxide film or the like so that it disturbs easy transfer of surface charge.

It was considered before the completion of the invention that when a step of removing the etch stop film 33 includes the nitrogen plasma treatment 102 (FIG. 13), a sufficient electrostatic charge removal effect can be obtained by carrying out the nitrogen plasma treatment for a longer period of time. The above results have however revealed that due to miniaturization or increase in the number of interconnect layers, the electrostatic charge removal effect is not sufficient only by prolonging the nitrogen plasma treatment time.

It can therefore be presumed that (1) the via-bottom conduction failures in this mode occur due to corrosion of the upper surface of lower-level buried interconnects in the vicinity of the via bottom caused by an electrolysis reaction during the wet cleaning step 106 (FIG. 13) resulting from electrostatic charge accumulated in the vicinity (upper surface, each interconnect layer) of the surface on the side of the device surface $1a$ of the wafer 1 during dry etching of an etch stop film and subsequent plasma treatment, (2) these via-bottom conduction failures can be almost suppressed by electrostatic-charge removal using plasma in an argon atmosphere, (3) generation of conduction failures can be reduced further by adjusting the length of a lead interconnect to less than 1000 μm, preferably less than 800 μm, (4) a defective ratio increases rapidly due to scale down of a via size, (5) the conduction failures occur very markedly in the uppermost-level buried interconnect, and (6) the conduction failures occur very markedly when the lower-level buried interconnect is a third-level buried interconnect or higher.

4. Summary

The inventions made by the present inventors were described specifically based on embodiments of the invention. It should however be borne in mind that the invention is not limited by them but can be changed without departing from the scope of the invention.

For example, specific description was made with the uppermost-level buried interconnect as an example, but the invention is not limited to it but can be applied to a step of removing an etch step film from a buried interconnect of another layer.

In the above embodiments, description was made with a copper based damascene interconnect as an example, but needless to say, the invention is not limited to it but can be applied to similar steps of a copper-based damascene interconnect or another buried interconnect.

Further, the above embodiment was described specifically while using, as an example, the case where the dry etching step 101 (FIG. 13) of the etch stop insulating film, nitrogen plasma treatment step 102, and electrostatic-charge removal step 103 using an argon plasma (FIG. 13) are carried out in one gas phase treatment chamber, but the invention is not limited to it. The respective steps may be carried out in the same apparatus or different apparatuses, or may be carried out in the same treatment chamber or different treatment chambers. As in the above embodiment, however, a series of these steps carried out on one wafer stage in one gas phase treatment chamber in one apparatus is advantageous from the standpoints of reduction in treatment time and effective utilization of the equipment.

In the above-described embodiments, the description was made using a parallel plate type dry etching apparatus mainly. The present invention is not limited to it but needless to say, can be applied to the case where ICP (inductively coupled plasma) type, electron cyclotron resonance type, or a helicon type apparatus is employed.

What is claimed is:

1. A manufacturing method of a semiconductor integrated circuit device comprising the steps of:
   (a) carrying out first dry etching to form, toward a lower-level buried interconnect disposed in an insulating film over the device surface of a wafer, a via hole that extends from the upper surface of the insulating film to the upper surface of an etch stop film over the lower-level buried interconnect which is to be coupled to an upper-level buried interconnect;
   (b) after the step (a), carrying out, in an etching chamber, second dry etching to extend the via hole to the upper surface of the lower-level buried interconnect while the back surface of the wafer is retained on a wafer stage associated with an electrostatic chuck;
   (c) after the step (b), subjecting, in the etching chamber, the device surface of the wafer to gas phase plasma treatment in an atmosphere having nitrogen as a main component while the back surface of the wafer is retained on the wafer stage; and
   (d) after the step (c), removing electrostatic charge from the wafer by using gas phase plasma in an atmosphere having argon as a main component while the back surface of the wafer is retained on the wafer stage.

2. The manufacturing method of a semiconductor integrated circuit device according to claim 1, further comprising a step of:
   (e) after the step (d), subjecting at least the device surface of the wafer to wet cleaning treatment with a chemical solution outside the etching chamber.

3. The manufacturing method of a semiconductor integrated circuit device according to claim 1, wherein the lower-level buried interconnect is a third-level or higher level buried interconnect.

4. The manufacturing method of a semiconductor integrated circuit device according to claim 1, wherein the upper-level buried interconnect is an uppermost-level buried interconnect.

5. The manufacturing method of a semiconductor integrated circuit device according to claim 1, wherein the upper-level buried interconnect is electrically coupled to a pad electrode lying thereover.

6. The manufacturing method of a semiconductor integrated circuit device according to claim 5, wherein the upper-level buried interconnect is directly coupled to the pad electrode via a plug immediately therebelow.

7. The manufacturing method of a semiconductor integrated circuit device according to claim 1, wherein the upper-level buried interconnect and the lower-level buried interconnect are each a copper-based buried interconnect.

8. The manufacturing method of a semiconductor integrated circuit device according to claim 2, further comprising a step of:
   (f) after the step (d) but prior to the step (e), releasing the wafer from the wafer stage in the etching chamber.

9. The manufacturing method of a semiconductor integrated circuit device according to claim 1, wherein the etch stop film is a silicon nitride insulating film.

10. The manufacturing method of a semiconductor integrated circuit device according to claim 1, wherein the etch stop film is an SiCN film.

11. A manufacturing method of a semiconductor integrated circuit device comprising the steps of:
    (a) burying a lower-level buried interconnect in a lower-level insulating film over the device surface of a wafer;
    (b) after the step (a), forming an etch stop film over the upper surface of the lower-level insulating film;
    (c) after the step (b), forming an upper-level insulating film over the etch stop film;
    (d) after the step (c), carrying out first dry etching to form a via hole that extends from the upper surface of the upper-level insulating film to the upper surface of the etch stop film over the lower-level buried interconnect which is to be coupled to an upper-level buried interconnect;
    (e) after the step (d), carrying out, in an etching chamber, second dry etching to extend the via hole to the upper surface of the lower-level buried interconnect while the back surface of the wafer is retained on a wafer stage associated with an electrostatic chuck;
    (f) after the step (e), subjecting, in the etching chamber, the device surface of the wafer to gas phase plasma treatment in an atmosphere having nitrogen as a main component while the back surface of the wafer is retained on the wafer stage; and
    (g) after the step (f), removing electrostatic charge from the wafer in the etching chamber by using gas phase plasma in an atmosphere having argon as a main component while the back surface of the wafer is retained on the wafer stage.

12. The manufacturing method of a semiconductor integrated circuit device according to claim 11, further comprising a step of:
    (e) after the step (d), subjecting at least the device surface of the wafer to wet cleaning treatment with a chemical solution outside the etching chamber.

13. The manufacturing method of a semiconductor integrated circuit device according to claim 11, wherein the lower-level buried interconnect is a third-level or higher level buried interconnect.

14. The manufacturing method of a semiconductor integrated circuit device according to claim 11, wherein the upper-level buried interconnect is an upper-most buried interconnect.

15. The manufacturing method of a semiconductor integrated circuit device according to claim 11, wherein the upper-level buried interconnect is electrically coupled to a pad electrode lying thereover.

16. The manufacturing method of a semiconductor integrated circuit device according to claim 15, wherein the upper-level buried interconnect is directly coupled to the pad electrode via a plug immediately therebelow.

17. The manufacturing method of a semiconductor integrated circuit device according to claim 11, wherein the upper-level buried interconnect and the lower-level buried interconnect are each a copper-based buried interconnect.

18. The manufacturing method of a semiconductor integrated circuit device according to claim 12, further comprising a step of:
- (f) after the step (d) but prior to the step (e), releasing the wafer from the wafer stage in the etching chamber.

19. The manufacturing method of a semiconductor integrated circuit device according to claim 11, wherein the etch stop film is a silicon nitride-based insulating film.

20. The manufacturing method of a semiconductor integrated circuit device according to claim 11, wherein the etch stop film is an SiCN film.

21. A manufacturing method of a semiconductor integrated circuit device, comprising:
- (a) forming an unfinished product comprising at least one buried interconnect, and an upper surface comprising a lower interlayer insulating film and a lower-level interconnect:
- (b) forming an etch stop film over the upper surface of the unfinished product;
- (c) forming an upper interlayer insulating film over the etch stop film;
- (d) forming, in the upper interlayer insulating film, a via hole which extends down to the etch stop film and a trench which connects to the via hole;
- (e) dry etching the etch stop film to extend the via hole down to the lower-level interconnect;
- (f) applying a gas phase plasma treatment in an atmosphere having nitrogen as a main component;
- (g) applying a gas phase plasma treatment in an atmosphere having argon as a main component after step (f);
- (h) forming a barrier film over surfaces of the trench and the via hole; and
- (i) depositing interconnect material over the barrier film in both the trench and the via hole to form an upper-level interconnect which connects to the lower-level interconnect.

22. The method according to claim 21, further comprising, after step (i):
- (j) removing excess interconnect material and barrier film;
- (k) forming an additional interlayer insulating film over the upper-level interconnect;
- (l) forming at least one plug in the additional interlayer insulating film; and
- (m) connecting the plug to a pad electrode.

23. The method according to claim 21, wherein said steps (e)-(g) are all performed in the same chamber.

24. The method according to claim 21, wherein:
the plasma treatment of step (f) suppresses generation of a carbon residue on a bottom surface of the via hole.

25. The method according to claim 21, wherein:
the plasma treatment of step (g) removes electrostatic charge.

26. A method for manufacturing a semiconductor integrated circuit device having at least three levels of buried interconnects including an upper-level buried interconnect which is connected to a pad electrode above and a lower-level buried interconnect below, the method comprising:
- (a) forming an etch stop film over the lower-level buried interconnect;
- (b) forming an upper interlayer insulating film over the etch stop film;
- (c) forming, in the upper interlayer insulating film, a via hole which extends down to the etch stop film and a trench which connects to the via hole;
- (d) dry etching the etch stop film to extend the via hole down to the lower-level interconnect;
- (e) applying a gas phase plasma treatment in an atmosphere having nitrogen as a main component;
- (f) applying a gas phase plasma treatment in an atmosphere having argon as a main component after step (e);
- (g) forming a barrier film over surfaces of the trench and the via hole;
- (h) depositing interconnect material over the barrier film in both the trench and the via hole to form an upper-level interconnect which connects to the lower-level interconnect;
- (i) forming an additional interlayer insulating film over the upper-level interconnect;
- (j) forming at least one plug in the additional interlayer insulating film; and
- (k) forming the pad electrode to connect the plug.

* * * * *